US012665610B2

(12) United States Patent
Pinchback

(10) Patent No.: US 12,665,610 B2
(45) Date of Patent: **\*Jun. 23, 2026**

(54) DIGITALLY TRIMMABLE INPUT CURRENT CANCELLATION CIRCUIT FOR ANALOG-TO-DIGITAL CONVERTER

(71) Applicant: KeyTek Semiconductor HongKong Limited, HongKong (CN)

(72) Inventor: Mark A. Pinchback, Healdsburg, CA (US)

(73) Assignee: KeyTek Semiconductor HongKong Limited, HongKong (CN)

( * ) Notice: Subject to any disclaimer, the term of this patent is extended or adjusted under 35 U.S.C. 154(b) by 78 days.

This patent is subject to a terminal disclaimer.

(21) Appl. No.: 18/406,130

(22) Filed: Jan. 6, 2024

(65) Prior Publication Data

US 2025/0119157 A1 Apr. 10, 2025

Related U.S. Application Data

(60) Provisional application No. 63/542,463, filed on Oct. 4, 2023.

(51) Int. Cl.
*H03M 3/00* (2006.01)
(52) U.S. Cl.
CPC .................................. *H03M 3/488* (2013.01)
(58) Field of Classification Search
CPC ....... H03M 3/488; H03M 3/458; H03M 3/494
See application file for complete search history.

(56) References Cited

U.S. PATENT DOCUMENTS

| | | | | |
|---|---|---|---|---|
| 5,691,720 A | * | 11/1997 | Wang ..................... | H03M 3/392 |
| | | | | 341/172 |
| 5,745,060 A | * | 4/1998 | McCartney ............. | H03M 3/38 |
| | | | | 341/172 |

(Continued)

OTHER PUBLICATIONS

LTC6813-1 Data Sheet, Rev. B, Analog Devices, 90 pages (Nov. 2020).

(Continued)

*Primary Examiner* — Lam T Mai
(74) *Attorney, Agent, or Firm* — Imperium Patent Works LLP; T. Lester Wallace

(57) ABSTRACT

An analog-to-digital converter circuit usable for measuring a voltage having a large common-mode voltage includes two input voltage nodes, a voltage sensing circuit (that includes a sigma-delta modulator) that senses a voltage between the nodes, a digital filter that outputs a multi-bit digital value, and an input current cancellation circuit. The input current cancellation circuit supplies/draws cancellation currents to/from the nodes to compensate for currents drawn from/supplied to the nodes by the voltage sensing circuit. The input current cancellation circuit includes a digitally-programmable digital processing circuit and a current canceling circuit. In one example, the digital processing circuit includes a sigma-delta modulator that transforms a single-bit digital signal output by the voltage sensing circuit into a single-bit digital signal that drives the current canceling circuit. The transfer function of the current compensation loop is programmable and adjustable by loading digital trim values into the circuit.

23 Claims, 20 Drawing Sheets

COMPENSATION DRIVEN DIRECTLY FROM AN ARBITRARY, NTH-ORDER SIGMA-DELTA MODULATOR'S COMPARATOR DATA, THROUGH A DIGITAL, SIGMA-DELTA MODULATOR USED TO CORRECT FOR LIMITED MODULATION DEPTH AND MODULATION OFFSET

(56)         References Cited

U.S. PATENT DOCUMENTS

| | | | |
|---|---|---|---|
| 6,204,785 B1 * | 3/2001 | Fattaruso | H03M 1/1057 |
| | | | 341/120 |
| 6,307,496 B1 * | 10/2001 | Ikuta | G01D 3/0365 |
| | | | 702/6 |
| 6,433,723 B1 * | 8/2002 | Randall | H03M 1/0641 |
| | | | 341/131 |
| 8,842,030 B1 * | 9/2014 | Fontaine | H03M 3/368 |
| | | | 341/143 |
| 9,182,428 B2 | 11/2015 | Kultgen et al. | G01R 19/0023 |
| 10,658,018 B2 * | 5/2020 | Baker | G11C 8/08 |
| 2014/0218115 A1 * | 8/2014 | Huang | H03F 3/45183 |
| | | | 330/261 |
| 2019/0128932 A1 * | 5/2019 | Fernandez | G01R 19/2506 |
| 2024/0243662 A1 * | 7/2024 | Iorga | H02M 1/123 |

OTHER PUBLICATIONS

ADBMS1818 Data Sheet, Rev. B, Analog Devices, 92 pages (Jan. 2021, Rev 0: Initial Version) (Revised Sep. 2023).
LTC2484 Data Sheet, LT 1014 Rev F, Linear Technology Corporation, 42 pages (2005).

* cited by examiner (PRIOR ART)

Phase A, Q=C1*V$_{BAT}$

Phase B, Q=C1*V$_{BAT}$

Current = (Q$_{PH\_A}$ + Q$_{PH\_B}$)/T = 2*C1*V$_{BAT}$*F$_{SAMPLE}$, Where F$_{SAMPLE}$ = 1/T.

(PRIOR ART)

SWITCHED-CAPACITOR INPUT AVERAGE
SAMPLING CURRENT (PRIOR ART)
VOLTAGE SENSING ERROR AND EFFECTIVE
INPUT RESISTANCE OF SAMPLING NETWORK (PRIOR ART)

2-PHASE, INJECTION OF A COMPENSATING DIFFERENTIAL, CURRENT ACROSS THE ISOLATION BARRIER (PRIOR ART)

COMPENSATION DRIVEN FROM PARALLEL SAMPLER AND
BUFFER NETWORK (PRIOR ART)

COMPENSATION DRIVE FROM FIRST-ORDER SIGMA-DELTA
MODULATOR USING 2-PHASE SWITCHED-CAPACITOR AND
REFERENCE REVERSAL SWITCHES (PRIOR ART)

COMPENSATION DRIVE FROM FIRST-ORDER SIGMA-DELTA
MODULATOR USING TWO CURRENT MIRRORS

DIGITALLY VARIABLE, 2-PHASE, INJECTION OF A DIFFERENTIAL
COMPENSATION CURRENT ACROSS THE ISOLATION BARRIER,
USING A PULSE DENSITY MODULATED, SYNCHRONOUS, SERIAL
DATA STREAM (DATA)

COMPENSATION DRIVEN DIRECTLY FROM (UNIPOLAR)
FIRST-ORDER SIGMA-DELTA MODULATOR COMPARATOR DATA,
USING A 2-PHASE, SWITCHED-CAPACITOR, SYNCHRONOUS,
SERIALLY DIGITALLY MODULATED COMPENSATION NETWORK

VCOMP GEN CIRCUIT

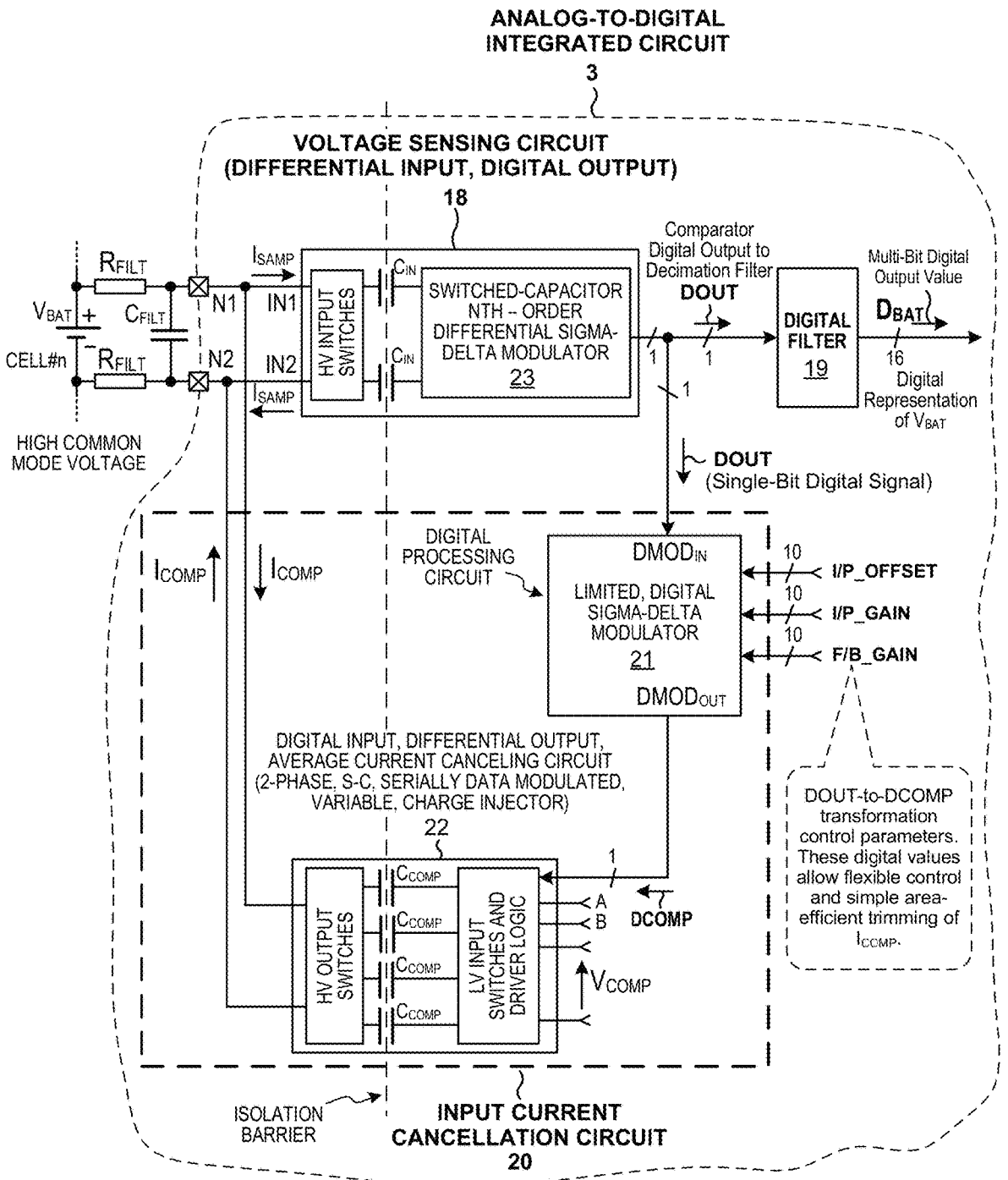

ANALOG-TO-DIGITAL
INTEGRATED CIRCUIT
3

VOLTAGE SENSING CIRCUIT
(DIFFERENTIAL INPUT, DIGITAL OUTPUT)
18

$R_{FILT}$ $V_{BAT}$ +

$C_{FILT}$

CELL#n $R_{FILT}$

HIGH COMMON
MODE VOLTAGE $I_{SAMP}$

N1   IN1

N2   IN2

$I_{SAMP}$

HV INPUT SWITCHES $C_{IN}$ $C_{IN}$

SWITCHED-CAPACITOR
NTH -- ORDER
DIFFERENTIAL SIGMA-
DELTA MODULATOR
23

Comparator
Digital Output to
Decimation Filter
DOUT

1
1

1

Multi-Bit Digital
Output Value $D_{BAT}$

DIGITAL
FILTER
19

16
Digital
Representation
of $V_{BAT}$

DOUT
(Single-Bit Digital Signal)

$I_{COMP}$   $I_{COMP}$

DIGITAL
PROCESSING
CIRCUIT

DMOD$_{IN}$

LIMITED, DIGITAL
SIGMA-DELTA
MODULATOR
21

DMOD$_{OUT}$

10   I/P_OFFSET
10   I/P_GAIN
10   F/B_GAIN

DIGITAL INPUT, DIFFERENTIAL OUTPUT,
AVERAGE CURRENT CANCELING CIRCUIT
(2-PHASE. S-C, SERIALLY DATA MODULATED,
VARIABLE, CHARGE INJECTOR)
22

HV OUTPUT SWITCHES $C_{COMP}$
$C_{COMP}$
$C_{COMP}$
$C_{COMP}$

LV INPUT SWITCHES AND DRIVER LOGIC

1

A
B $DCOMP$ $V_{COMP}$

DOUT-to-DCOMP
transformation
control parameters.
These digital values
allow flexible control
and simple area-
efficient trimming of
$I_{COMP}$.

ISOLATION
BARRIER

INPUT CURRENT
CANCELLATION CIRCUIT
20

COMPENSATION DRIVEN DIRECTLY FROM AN ARBITRARY,
NTH-ORDER SIGMA-DELTA MODULATOR'S COMPARATOR DATA,
THROUGH A DIGITAL, SIGMA-DELTA MODULATOR USED TO CORRECT
FOR LIMITED MODULATION DEPTH AND MODULATION OFFSET

FIG. 16

DETAIL OF THE 2-PHASE, S-C, SERIALLY-MODULATED, VARIABLE
CHARGE INJECTOR SHOWING SWITCH CONTROL LOGIC

FIRST-ORDER, LIMITED, DIGITAL SIGMA-DELTA MODULATOR

EXAMPLE TRANSFORMATION OF SERIAL PULSE
DENSITY BY A DIGITAL SIGMA-DELTA MODULATOR

OBSERVED WAVEFORMS AND NODE N1 AND N2
FOR PRIOR ART CIRCUIT OF FIG. 9 V$_{(N1,N2)}$ IS
RESTORED TO V$_{BAT}$ WITHIN T/2.

OBSERVED, DIFFERENTIAL VOLTAGE BETWEEN NODES N1 AND N2, $V_{(N1,N2)}$, FOR CIRCUIT OF FIG. 15, WHEN INPUT VOLTAGE IS CLOSE TO UNI-POLAR FULL-SCALE.

OBSERVED, DIFFERENTIAL VOLTAGE BETWEEN NODES N1 AND
N2, V$_{(N1,N2)}$, FOR CIRCUIT OF FIG. 15, WHEN INPUT VOLTAGE IS
CLOSE TO UNI-POLAR MID-SCALE.

OBSERVED, DIFFERENTIAL VOLTAGE BETWEEN NODES N1 AND N2, $V_{(N1,N2)}$, FOR CIRCUIT OF FIG. 15, WHEN INPUT VOLTAGE IS CLOSE APPROX 25% OF UNI-POLAR FULL-SCALE.

DIGITALLY TRIMMABLE INPUT CURRENT CANCELLATION CIRCUIT FOR ANALOG-TO-DIGITAL CONVERTER

CROSS REFERENCE TO RELATED APPLICATION

This application claims the benefit under 35 U.S.C. § 119 (e) from U.S. Provisional Application No. 63/542,463, entitled "Low-Latency, Average Input Current Cancellation For Differential Input, Voltage-Sensing, Switched-Capacitor, Sigma-Delta Modulators," filed on Oct. 4, 2023. The entirety of the disclosure of the foregoing document is incorporated herein by reference.

TECHNICAL FIELD

This disclosure relates to voltage sensing circuits including voltage sensing circuits that measure differential voltages between high impedance nodes. It is particularly relevant to circuits where the voltages to be sensed have a high common-mode voltage and where the sensing circuit comprises the input stage of a delta-sigma modulator for high resolution measurement.

BACKGROUND INFORMATION

Sensing a differential voltage, accurately, between two nodes with a high common-mode voltage is a difficult task. The challenges involve isolation of the high common-mode voltage from as much of the measurement circuit as possible. This isolation removes the high common-mode voltage and allows the majority of the circuit to operate only with the low voltages commensurate with the differential voltage amplitude. Operating with these lower voltages allows for minimization of the physical size of the overall circuit, lower operating power and higher operating speed.

Additionally, it is highly desirable to maximize the input impedance presented by the differential voltage sensing circuit. A high input impedance will minimize any errors which may be introduced by the interaction of any source impedance with the sensing circuit's finite input impedance. A typical source impedance might be an RC filter as may be used to provide filtering of high-frequency electrical noise and to provide both anti-alias and input protection functions.

Switched-capacitor circuits, particularly sigma-delta converters, are often used to provide high accuracy voltage sensing. When using a suitable differential-input sampling circuit configuration, high-voltage capable capacitors may be used as both the isolation barrier components and simultaneously as the input sampling capacitors for the converter. Such an arrangement limits the high common-mode voltage to just one side of the barrier, which encompasses one capacitor plate of each of the high-voltage sampling capacitors and a small number of related switches operating at closely related voltages. All the remaining circuitry, including the second plates of the high-voltage input sampling capacitors, may be contained on the low-voltage side of the isolation barrier.

The charging and discharging of the sampling/isolating capacitors create a signal-dependent differential charge transfer between the input terminal pairs. If the sampling rate is low, and the time constants of the input network are sufficiently small compared to the sampling period, almost complete charge redistribution can occur during each sampling period and the remaining current and associated IR drops will be small. In this case minimal sampling related errors occur, and the input impedance appears very high.

Typically, this is not the case. The presence of an RC filter in the input signal path creates a time constant significantly longer than the sampling period of the switched-capacitor network. In this case, the RC filter causes a residual current which continues to flow through and beyond the end of the sampling interval. When the input signal frequency is low and the associated anti-alias filter time constant is correspondingly long compared to the sampling period, an error associated with this residual current is captured, usually in the form of a time averaged IR drop across the source resistance of the RC filter.

Cancellation of the input signal dependent charge transfer, over either one or a small number of input sampling events can reduce the redistribution currents that must flow in the R of the RC filter. This may be used to substantially reduce or even fully eliminate the associated measurement error and thereby improve the voltage sensing accuracy significantly.

Whether it is necessary to cancel the sampling charge transfer over just one sampling event, or alternatively, if canceling over a number of sampling events is sufficient, will depend on the nature of the circuitry following the sampling circuit. For instance, using a Nyquist-rate ADC converter will require cancellation of the sampling charge over a single sample period. Using a Nyquist-rate ADC converter with additional averaging or using an oversampled ADC converter relaxes the requirement and allows the average charge transfer over several input sampling events to be canceled instead. The residual error will depend on the exact time and frequency domain characteristics of the filtering involved.

SUMMARY

An integrated circuit includes a first node and a second node. A voltage sensing circuit of the integrated circuit senses a differential voltage between the two nodes that have a high non-zero common-mode voltage. The differential input forms the input sampling capacitor and switch network for a sigma-delta converter such that the sigma-delta converter produces a single-bit digital bit stream output where the average value of that digital bit stream is proportional to the differential input voltage, but which may also include an offset, a gain factor, and a time delay—all dependent on the specific characteristics of the sigma-delta modulator. The sigma-delta input sampling network, as a by-product of its sampling operation, generates a signal dependent, time averaged input current that creates an associated error voltage in conjunction with the finite resistance of any source RC filter present.

A charge injection circuit of an input current cancellation circuit of the integrated circuit injects a compensating charge transfer in response to a modulated single-bit digital bit stream signal. The input current cancellation circuit may be arranged such that it injects a sequence of charges over time, at the analog input sampling rate, that substantially cancels the signal dependent differential input current created by the modulator's input sampling network. With respect to an input node of the voltage sensing circuit, the term cancel means that the average current supplied out of the input current cancellation circuit to the node or the average current received into the input current cancellation circuit from the node matches either the average current being drawn into the voltage sensing circuit from the node or the current being output from the voltage sensing circuit to the node. If the voltage sensing circuit is drawing a current from the node then the input current cancellation circuit supplies a current onto the node, whereas if the voltage sensing circuit is outputting a current onto the node then the input current cancellation circuit receives a current from the node.

The modulated single-bit digital bit stream signal, that controls the compensating charge injection, is derived directly from the single-bit digital bit stream output of the analog sigma-delta modulator and advantageously at the modulator's high sample rate, using a compensating circuit that is capable of correcting for the offset, and gain factors of the analog sigma-delta modulator. In one example, a simple digital sigma-delta modulator receives the single-bit digital bit stream from the output of the analog sigma-delta modulator and generates the modulated single-bit digital bit stream signal.

Unlike previous charge compensation schemes, which use an additional, parallel sampling path to determine the necessary compensation signal level, the disclosed invention can directly reuse the preexisting analog modulator's digital output stream—whatever the order of the modulator and in the presence or otherwise of an intentional input referred offset. This means there is no additional sampling capacitance that will further increase both the error and the necessary compensation level.

Moreover, given that the charge compensation control signal is generated from the input voltage related digital stream, in the digital domain, it is much easier to make small changes to the exact desired offset and gain correction factors, so as to accurately trim the compensation level to an ideal value. This trimming is achieved by simply changing the coefficients of the digital modulator, whilst using fixed component values in the analog domain. This may significantly relax the accurate component value match and area expensive trimming networks otherwise needed by existing compensation schemes.

In a first novel aspect, an integrated circuit comprises a first node, a second node, and an analog-to-digital circuit. The analog-to-digital circuit in turn comprises a differential input voltage sensing circuit and an input current cancellation circuit. The differential input voltage sensing circuit senses a voltage between the first node and the second node, and outputs a multi-bit digital output value indicative of the voltage. The voltage sensing circuit draws a first current into the voltage sensing circuit from the first node (or outputs the first current from the voltage sensing circuit to the first node) as the analog-to-digital circuit performs an analog-to-digital conversion. The voltage sensing circuit draws a second current into the voltage sensing circuit from the second node (or outputs the second current from the voltage sensing circuit to the second node) as the analog-to-digital circuit performs the analog-to-digital conversion. The voltage sensing circuit in one example comprises an analog sigma-delta modulator circuit that outputs a single-bit digital bit stream signal.

The input current cancellation circuit is coupled to the first node and to the second node. The input current cancellation circuit supplies a third current onto the first node (or draws the third current from the first node) to cancel substantially the first current, and the input current cancellation circuit supplies a fourth current onto the second node (or draws a fourth current from the second node) to cancel substantially the second current. Importantly, the input current cancellation circuit comprises a digital sigma-delta modulator circuit that receives the single-bit digital bit stream signal from the voltage sensing circuit. In one example, the input current cancellation circuit further comprises a switched-capacitor, serial data modulated, charge injector circuit. The digital sigma-delta modulator circuit of the input current cancellation circuit outputs a modulated single-bit digital bit stream signal that is supplied as an input to control the charge injector circuit. The charge injector circuit in turn outputs the third and fourth currents onto the first and second nodes.

In a second novel aspect, an analog-to-digital converter integrated circuit includes a voltage sensing circuit, an input current cancellation circuit, and a digital interface circuit. The digital interface circuit is usable to load a multi-bit digital input gain trim value, a multi-bit digital input offset trim value, and a multi-bit digital feedback gain trim value onto the integrated circuit. The three multi-bit digital trim values are supplied as input values to configure and to control the input current cancellation circuit. The three multi-bit digital trim values are stored in one or more first digital registers. Circuitry outside the integrated circuit can load three multi-bit digital trim values onto the integrated circuit and into the one or more first digital registers using the digital interface circuit.

In some examples, the analog-to-digital converter integrated circuit further comprises one or more second digital registers and a compensation voltage generator circuit. The one or more second digital registers store a multi-bit compensation voltage value. The compensation voltage generator circuit receives the multi-bit compensation voltage value and outputs a corresponding compensation voltage that is supplied to the input current cancellation circuit. Circuitry outside the integrated circuit can load compensation voltage value onto the integrated circuit and into the one or more second digital registers using the digital interface circuit.

Further details and embodiments and methods and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 16 is a diagram of a part of the analog-to-digital converter integrated circuit 3 in accordance with one embodiment of the invention. The analog-to-digital converter integrated circuit 3 includes two input voltage terminals and corresponding nodes N1 and N2, a voltage sensing circuit 18, a digital filter 19, a digital processing circuit (a digital sigma-delta modulator) 21, and an average current canceling circuit 22. The digital sigma-delta modulator 21 transforms the analog modulator's data stream DOUT into a second data stream DCOMP, the pulse density of which is more appropriately optimized for the cancellation of the analog modulator's average differential input current over a desired operating region.

DETAILED DESCRIPTION

Reference will now be made in detail to background examples and some embodiments of the invention, examples of which are illustrated in the accompanying drawings.

It is often necessary to sense and to measure a small differential voltage between nodes that have a large common-mode voltage. For example, it may be necessary to measure the voltage of one battery cell that is connected in a large series of battery cells. The large common-mode voltage must not create a significant error in the measurement of the differential voltage.

Figure 1:
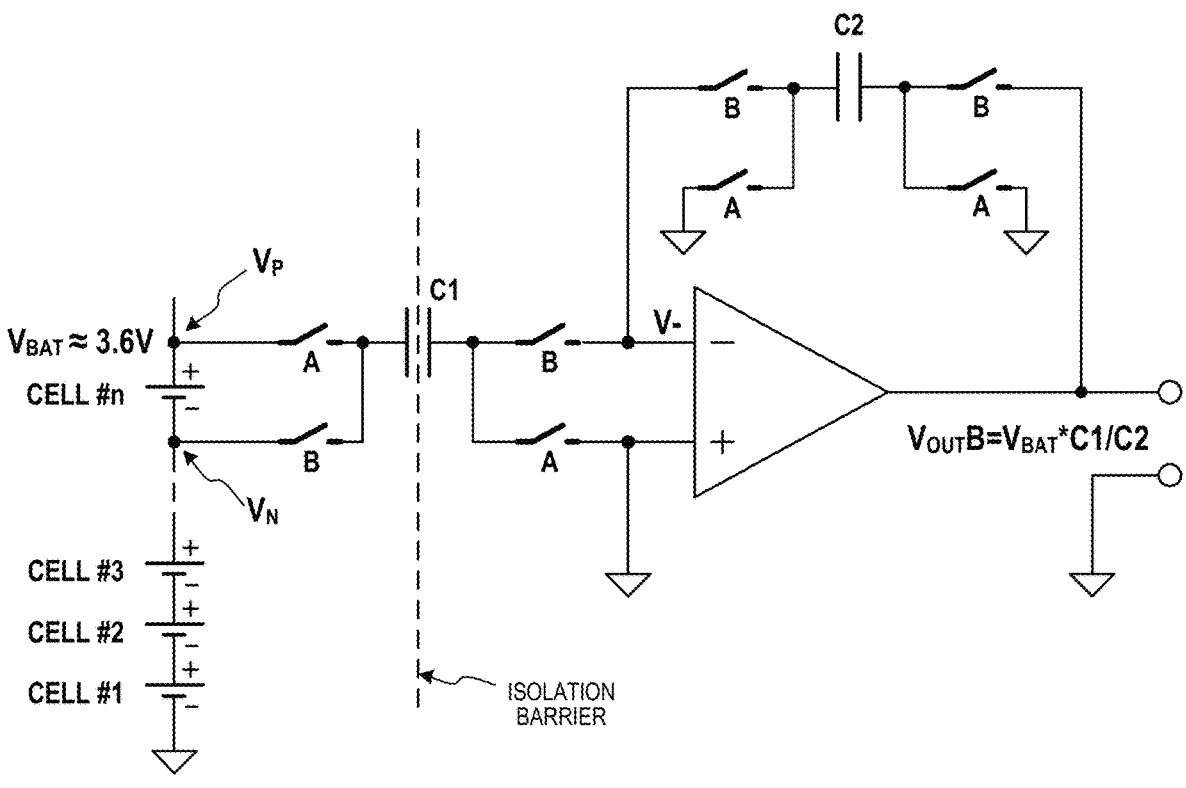
FIG. 1 illustrates an example of prior art for sensing the differential voltage between two nodes that have a differential signal and may have a non-zero, common-mode voltage that can be high. The common mode voltage is limited by the electrical breakdown voltage of the capacitor's dielectric.

FIG. 1 illustrates an example of prior art for sensing the differential voltage between two nodes that have a differential signal and may have a non-zero, common-mode voltage that can be high. The circuit comprises electronic switches operating in phases A and B, capacitors C1 and C2 and an inverting amplifier.

Figure 2:
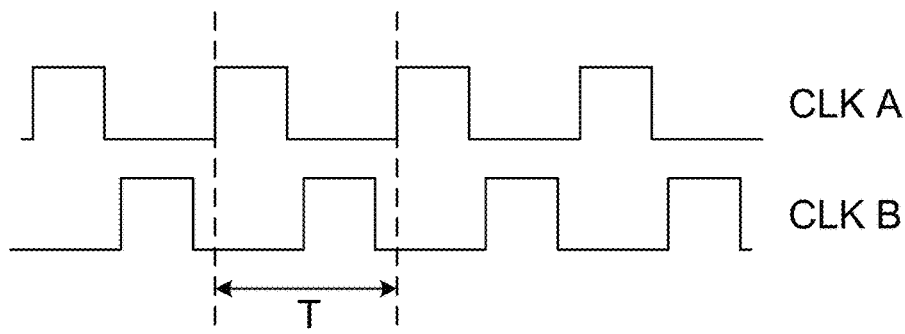
FIG. 2 illustrates the quadrature (2-phase), non-overlapping clock signals that are used to control the operation and timing of the switches in the prior art of FIG. 1 and similar precision switched-capacitor circuits.

FIG. 2 illustrates an example of prior art, quadrature (2-phase), non-overlapping clock signals that are used to control the operation and timing of the switches in the prior art of FIG. 1. The electronic switches labeled A in FIG. 1 were arranged to close when CLK A in FIG. 2 is high and open when CLK A is low. The electronic switches labeled B in FIG. 1 were arranged to close when CLK B in FIG. 2 is high and open when CLK B is low. Since CLK A was only allowed to be high after CLK B was low and CLK B was only allowed to be high after CLK A was low, switches labeled A were never closed at the same time as switches labeled B.

Periodically opening and closing the groups of switches A and B sequentially caused charge to be transferred between the battery cell and the capacitors. When averaged over a period time equal to one or more full clock periods (T) the charge transfer resembles a current of magnitude $I=\Delta Q/\Delta T$. This charge transfer is a fundamental principle by which switched-capacitor circuits operate.

The charge transfer equations, now presented, illustrate how the circuit of FIG. 1 amplified the battery voltage VBAT while rejecting the common-mode voltage (VP+VN)/2.

During Phase A, the charges on the capacitors C1 and C2 is given by:

$$QC1A = C1*(V_P - 0) \qquad \text{(Eq. 1A)}$$

$$QC2A = C2*(0 - 0) \qquad \text{(Eq. 1B)}$$

During Phase B, the charges on the capacitors become.

$$QC1B = C1*(V_N - V-) \qquad \text{(Eq. 2A)}$$

$$QC2B = C2*(V_{OUT}B - V-) \qquad \text{(Eq. 2B)}$$

The inverting amplifier was arranged to have a very high gain and forces the signal V− at the inverting terminal of the amplifier to be very, very close to ground by way of negative feedback through C2. If the gain is sufficiently high V−=0V. In this case we can simplify Equations 2A and 2B as:

$$QC1B = C1*(V_N - 0) \qquad \text{(Eq. 3A)}$$

$$QC2B = C2*(V_{OUT}B - 0) \qquad \text{(Eq. 3B)}$$

The principle of conservation of charge requires that the sum of change in charge on C1 and the change in charge on C2 is zero—such that charge is not created or destroyed.

$$(QC1A - QC1B) + (QC2A - Q2CB) = 0 \qquad \text{(Eq. 4)}$$

Substituting Equations 1A, 1B, 3A and 3B into Equation 4 yields:

$$C1*(V_P - V_N) + C2*(0 - V_{OUT}B) = 0 \qquad \text{(Eq. 5)}$$

Rearranging to solve for $V_{OUT}B$:

$$V_{OUT}B = C1/C2*(V_P - V_N) \qquad \text{(Eq. 6)}$$

It is clear that the output voltage of the amplifier is an amplified version of the differential input voltage $(V_P - V_N)$ or more generally $V_{BAT}$. The common mode voltage of $(V_P + V_N)/2$ has been completely rejected.

In the circuit of FIG. 1, the capacitor C1 forms a voltage isolation barrier across the capacitor's dielectric layer—illustrated by the dashed line. The switches to the left of this isolation barrier and the connected capacitor plate are exposed to high voltages. All the components to the right of the barrier—the majority of the circuit—see only low voltages of similar magnitude to the differential voltage signal. The common-mode voltage which may be rejected is limited by the electrical breakdown voltage of the capacitor used for C1. The breakdown voltage may be controlled by the physical spacing between the capacitor plates and by the specific material used to form the dielectric.

Figures 5, 6:
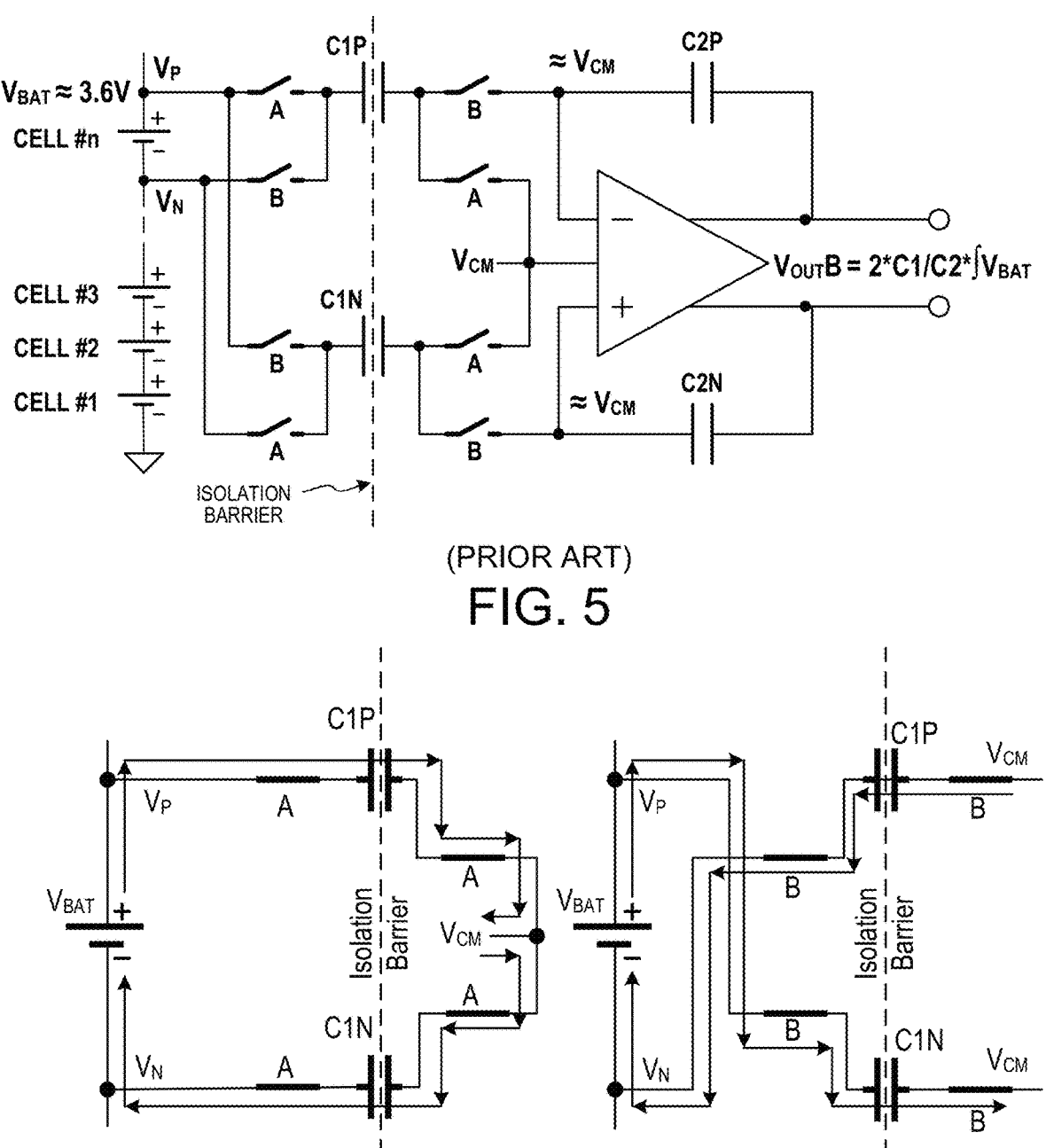
FIG. 5 illustrates an example of prior art where the differential signal can be integrated over time, in the presence of a high, non-zero common-mode voltage, while still maintaining a fully differential output signal. Examples of this prior art are common as the first stage of sigma-delta modulators which comprise the critical component of sigma-delta Analog-to-Digital Converters.
FIG. 6 illustrates the flow of charging currents for the voltage sensing capacitors (C1P and C1N) inherent in the operation of the circuit of FIG. 5.

Those skilled in the art will recognize that the circuit of FIG. 1 is not limited to performing only an amplification function and, with small changes to the circuitry on the low-voltage side of the isolation barrier, the circuit may be further enhanced to implement many important functions. Examples include the input stage of a sample and hold function as might be used in a Successive Approximation or Cyclic ADC or to form the first stage, fully differential, integrator of an analog sigma-delta modulator, as shown in FIG. 5. Standard error correction techniques, common in the equivalent low-voltage circuits, such as auto-zero (to remove the input stage offset error and flicker noise) may equally well be applied to the circuit of FIG. 1 and in FIG. 5 despite the use of the capacitor(s) C1 as an isolation barrier.

Moreover, as long as C1 is manufactured using standard semiconductor manufacturing techniques, on a semiconductor die alongside similar capacitors the properties of tight parameter matching allow for the same ratio-metric accuracy as is commonly achieved in standard low-voltage circuits.

The restriction of the high common-mode voltages to a small region of the circuit, limited to switches and capacitor plates, is highly advantageous allowing the majority of the circuit to be built with smaller spacing and therefore to be physically smaller and to operate at higher speeds and with lower power.

Figures 3, 4:
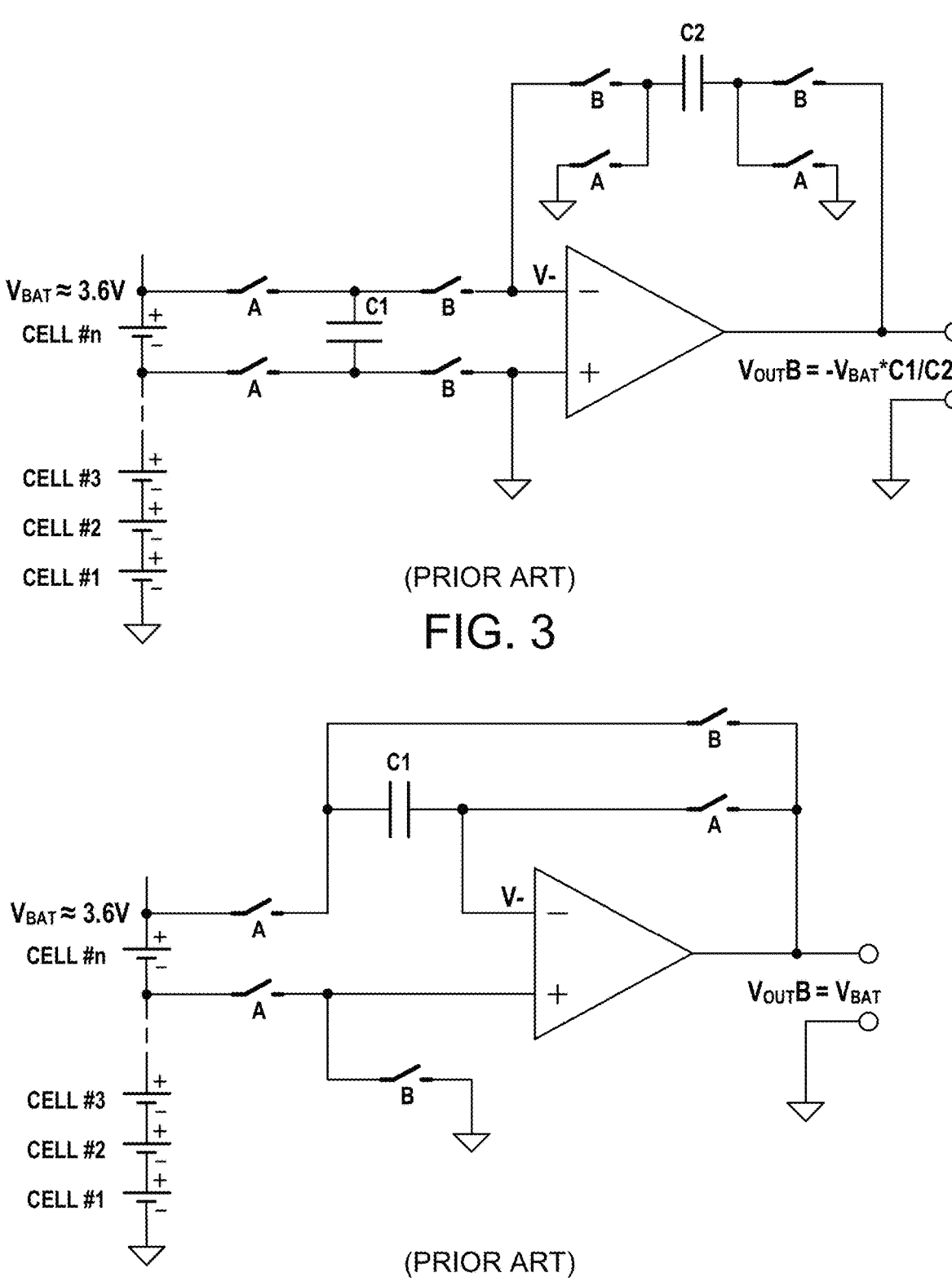
FIG. 3 illustrates an additional example of prior art that is capable of sensing the differential voltage in the presence of a high, non-zero common-mode voltage.
FIG. 4 illustrates an additional example of prior art that is capable of sensing the differential voltage in the presence of a high, non-zero common-mode voltage.

FIG. 3 and FIG. 4 illustrate additional prior art circuits that have been used to reject common-mode voltages. When the common-mode voltages are high, both of these circuits expose more of the active circuitry to the high voltages. In the example of FIG. 3, both plates of capacitor C1 and all the input switches will see high voltages. The inputs of the amplifier and switch B for capacitor C2 will also experience short periods of time where high voltages are present. In the example of FIG. 4, the input current is minimized because capacitor C1 is never discharged and does not need to be completely recharged each clock cycle. However, the amplifier, the capacitor and most switches experience high voltages. As a result, the circuits of FIG. 3 and FIG. 4 are difficult to protect from high voltage damage and are unsuitable for applications where there exist high common-mode voltages. The term "high common-mode voltage" as the term is used here denotes a common-mode voltage of 5 volts to 90 volts or more.

FIG. 5 illustrates a fully-differential input, fully-differential output integrator circuit that retains all the isolation advantages of FIG. 1. Those skilled in the art will recognize the advantages of the fully-differential input and output structure for achieving good rejection of power supply interference and other common-mode signal corruption. With the addition of matched (to C1) low-voltage, switched capacitors to form a reference feedback network path this circuit can form an analog, $1^{st}$ order sigma-delta modulator. Adding additional, purely low-voltage, integrators inside the feedback loop, with the addition of appropriate compensation paths, allows for the realization of higher order sigma-delta modulators. Higher order modulators allow for substantially lower quantization noise at a given over-sampling factor which results in faster, higher resolution, ADC conversion results at the same input sampling rate. $1^{st}$ order modulators are rarely used in modern designs. $2^{nd}$ order modulators are much more common, offering a good compromise between increased performance and ease of achieving unconditional modulator loop stability.

FIG. 6 illustrates the charging paths and change in charge through the input sampling capacitors in a 2-phase sampling network, as used in FIG. 5, with the clock phases as shown in FIG. 2. Unlike the circuit of FIG. 1 the circuit of FIG. 5 uses two input sampling capacitors. The capacitors are switched in anti-phase, such that during each phase of the clock signals, while one capacitor is charging from $V_N$ to $V_P$ the other is discharging from $V_P$ to $V_N$. The result is that the observed input charge transferred and therefore the average current over a full clock period is doubled for FIG. 5 compared to FIG. 1.

$$\text{Consider } CLK \ A:$$

$$\Delta Q \text{ for } C1P = \qquad\qquad \text{(Eq. 7A)}$$

$$QC1PA = C1P*(V_P - V_{CM}) - C1P*(V_N - V_{CM}) = C1P*(V_P - V_N)$$

$$\Delta Q \text{ for } C1N = QC1NA = \qquad\qquad \text{(Eq. 7B)}$$

$$C1N*(V_N - V_{CM}) - C1N*(V_P - V_{CM}) = -C1N*(V_P - V_N)$$

$$\text{Consider } CLK \ B:$$

$$\Delta Q \text{ for } C1P = QC1PB = \qquad\qquad \text{(Eq. 7C)}$$

$$C1P*(V_N - V_{CM}) - C1P*(V_P - V_{CM}) = -C1P*(V_P - V_N)$$

$$\Delta Q \text{ for } C1N = QC1NB = \qquad\qquad \text{(Eq. 7D)}$$

$$C1N*(V_P - V_{CM}) - C1N*(V_N - V_{CM}) = C1N*(V_P - V_N)$$

Consider the total charge flowing from $V_P$, from $V_N$ and from $V_{CM}$ over one clock period:

$$\text{Total } Q \text{ from } V_P = QC1PA + QC1NB = (C1P + C1N)(V_P - V_N) \quad \text{(Eq. 8A)}$$

$$\text{Total } Q \text{ from } V_N = QC1NA + QC1PB = -(C1N + C1P)(V_P - V_N) \quad \text{(Eq. 8B)}$$

$$\text{Total } Q \text{ from } V_{CM} = \qquad\qquad \text{(Eq. 8C)}$$

$$-(QC1PA + QC1NA) = -(C1P*(V_P - V_N) - C1N*(V_P - V_N))$$

Since $C1P = C1N = C1$ Equations $8A$ through $8C$ simplify to:

$$\text{Total } Q \text{ from } V_P = 2*C1*(V_P - V_N) \qquad \text{(Eq. 9A)}$$

$$\text{Total } Q \text{ from } V_N = -2*C1*(V_P - V_N) \qquad \text{(Eq. 9B)}$$

$$\text{Total } Q \text{ from } V_{CM} = 0 \qquad \text{(Eq. 9C)}$$

Equivalent current=charge change/Time and $F_{SAMPLE}=1/T$ so:

$$I\_(V_P) = 2*C1*(V_P - V_N)/T = \qquad \text{(Eq. 10A)}$$

$$2*C1*(V_P - V_N)*F_{SAMPLE} = 2*C1*V_{BAT}*F_{SAMPLE}$$

$$I\_(V_N) = -2*C1*(V_P - V_N)/T = \qquad \text{(Eq. 10B)}$$

$$2*C1*(V_P - V_N)*F_{SAMPLE} = -2*C1*V_{BAT}*F_{SAMPLE}$$

$$I\_(V_{CM}) = 0 \qquad \text{(Eq. 10C)}$$

The equivalent input resistance of the sampling network $R_{IN}$ is given by:

$$R_{IN} = \qquad\qquad \text{(Eq. 11)}$$

$$V/I = V_{BAT}/2*C1*V_{BAT}*F_{SAMPLE} = 1/(2*C1*F_{SAMPLE})$$

Figure 7:
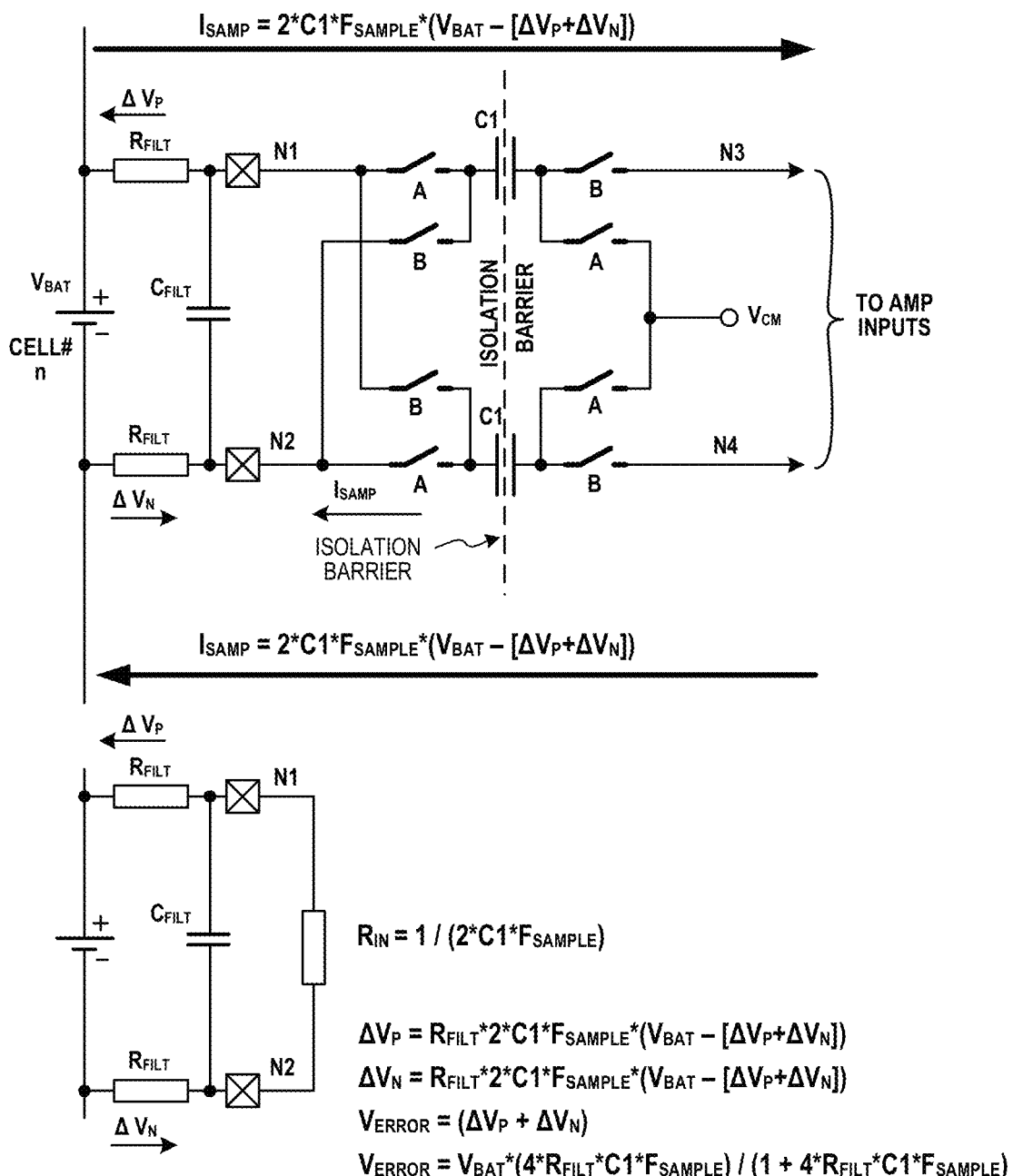
FIG. 7 illustrates how the time-averaged, charging currents shown by FIG. 6 interact with any low-pass input filter to create an error in the sensing of the true voltage at the battery terminals and derives an approximation for the finite input impedance of the sensing circuit.

FIG. 7 shows prior art with the introduction of a differential, RC, low-pass filter between the battery to be sensed and the switched-capacitor sampling input network. This filter may be desirable for many practical reasons. The battery cell to be measured may be part of a large stack of batteries connected to a load device that generates significant electrical noise. A common load device is a motor, which generates electrical noise as the motor current is switched either electronically or mechanically. The filter helps to reduce high-frequency components of the noise that may disturb the voltage sensing process and introduce an error in the measurement. The RC filter may also be used to help reduce the initial "In-rush" currents that flow into the semiconductor device pins when a charged or partially charged battery is initially connected to the measurement circuit. With the very high voltages present in a large battery array, these in-rush currents can be very large, even if the filter resistance is also relatively large. The RC filter now presents a significant source impedance to the sampling network The finite input impedance of the voltage sensing circuit will now interact with the source impedance of the RC filter. The interaction is complex, especially so, in the common case that either the voltage sensing circuit is shared across a number of battery cells, in a time-interleaved fashion, using a multiplexing circuit or alternatively, when sensing the voltage of a single cell in an intermittent manner. In both cases there is a steady-state error and a shorter-term transient error when the sampling begins and ends.

In the particular cases to which this invention is applicable, we are concerned only with the steady-state error. The transient error will generally dissipate before the actual start of the voltage sensing process. We may further assume that for the filter to be effective the filter capacitor $C_{FILT}$ is large compared to the input sampling capacitor C1 and that the filter time constant $R_{FILT}*C_{FILT}$ is large compared to the sampling period $T=1/F_{SAMPLE}$. Under these conditions it is a reasonable simplification to treat the load of the sampling network as it's equivalent switched-capacitor resistance given by Equation 11.

The error in the measurement of $V_{BAT}$ is a direct result of the filtered switched-capacitor input current flowing through the filter resistances $R_{FILT}$ and may be shown to be:

$$V_{ERROR} = \qquad\qquad \text{(Eq. 12)}$$

$$V_{BAT}*(4*R_{FILT}*C1*F_{SAMPLE})/(1 + 4*R_{FILT}*C1*F_{SAMPLE})$$

And if the error is small compared to $V_{BAT}$ then we may simplify this to:

$$V_{ERROR} = V_{BAT}*(4*R_{FILT}*C1*F_{SAMPLE}) \qquad \text{(Eq. 13)}$$

If we wish to minimize the error term we have three possibilities. Firstly, we might reduce the value of $R_{FILT}$. However this would reduce the effectiveness of $R_{FILT}$ in providing in-rush current protection and would require the value of $C_{FILT}$ to increase commensurately to retain the same level of source electrical noise suppression. This could lead to possibly unrealistic and physically large values for $C_{FILT}$. Secondly, we might reduce the value of C1. Those skilled in the art will realize this will cause higher input referred thermal noise to be captured in the modulator, reducing the available signal-to-noise ratio and degrading the measurement accuracy. Finally, we might reduce the sample frequency. This might require a lower frequency cut-off in the input filter, requiring a larger value for $C_{FILT}$ and will also reduce the oversampling factor available for a given measurement rate, causing an increase in quantization noise and rapid reduction in measurement accuracy. None of these options are attractive.

We can avoid all of these detrimental changes if we can create a current at the input filter's connection to the voltage sensing circuit that cancels the voltage sensing circuits dynamic input current. This compensating current must track and cancel the input current over the full input voltage operating range of the voltage sensing circuit. The prior art illustrated in FIG. 9 shows an example of how this can be achieved. Here, a switched capacitor charge injection circuit (as shown in the lower section of FIG. 8) is driven to create a parallel negative input current ($I_{COMP}$) which cancels the total positive input current at the sensed nodes ($I_{SAMP\_TOT}=I_{SAMP}+I_{SAMPX}$). To allow this cancellation to be maintained over the desired operating input range, a secondary input is added that forms a switched capacitor level-translator and buffer. This presents the compensating charge injection circuit with a reference input ($V_{BAT\_REP}$) that tracks the original input voltage and modulates the charge injection and the resulting negative, canceling input current, appropriately.

A significant penalty of the method of FIG. 9 is that it adds a second input sampling path along with the original input sampling path. The cancellation circuit must now provide additional negative compensation to cancel the positive contributions of both the desired primary sampling network ($I_{SAMP}$) and also that of the secondary sampling network ($I_{SAMPX}$) used by the buffer in the compensation loop. The sampling capacitors in the secondary input network may be significantly smaller than those in the primary sampler so as to limit the necessary increase in total compensation. This and other circuit non idealities (component mismatch, buffer offsets etc) may impose some limitation in the final accuracy of the current cancellation. We may show that the compensating circuit produces a charge transfer over both phases (1 cycle of operation) given by:

$$Q_{COMP} = C_{COMP} * (V_{BAT} - 2 * V_{\text{BAT\_REP}}) \qquad \text{(Eq. 14)}$$

$$I_{COMP} = F_{SAMPLE} * C_{COMP} * (V_{BAT} * -2 * V_{\text{BAT\_REP}}) \qquad \text{(Eq. 15)}$$

We may observe from Equation 15 that the compensating circuit also initially adds an additional positive input current of $V_{BAT}(C_{COMP})*F_{SAMPLE}$ to the source and then subtracts a value which depends linearly on $V_{BAT\_REP}$ and is $2*V_{BAT\_REP}*C_{COMP}$. If we arrange, (through the secondary sampling and buffer) for $V_{BAT\_REP}=V_{BAT}$ then Equation 15 becomes:

$$I_{COMP} = -F_{SAMPLE} * V_{BAT} * C_{COMP} \qquad \text{(Eq. 16)}$$

And if we wish to compensate just the original sampling current $I_{SAMP}=2*C1*V_{BAT}*F_{SAMPLE}$ then we need:

$$C_{COMP} = 2 * C1 \qquad \text{(Eq. 17)}$$

In practice we must also compensate for the secondary sampling network current driving the buffer ($I_{SAMPX}$) and also for any additional stray capacitors on the switched capacitor plates connected to the high-voltage side of the isolation barrier. So, in practice we find $C_{COMP}>2*C1$.

Figure 20:
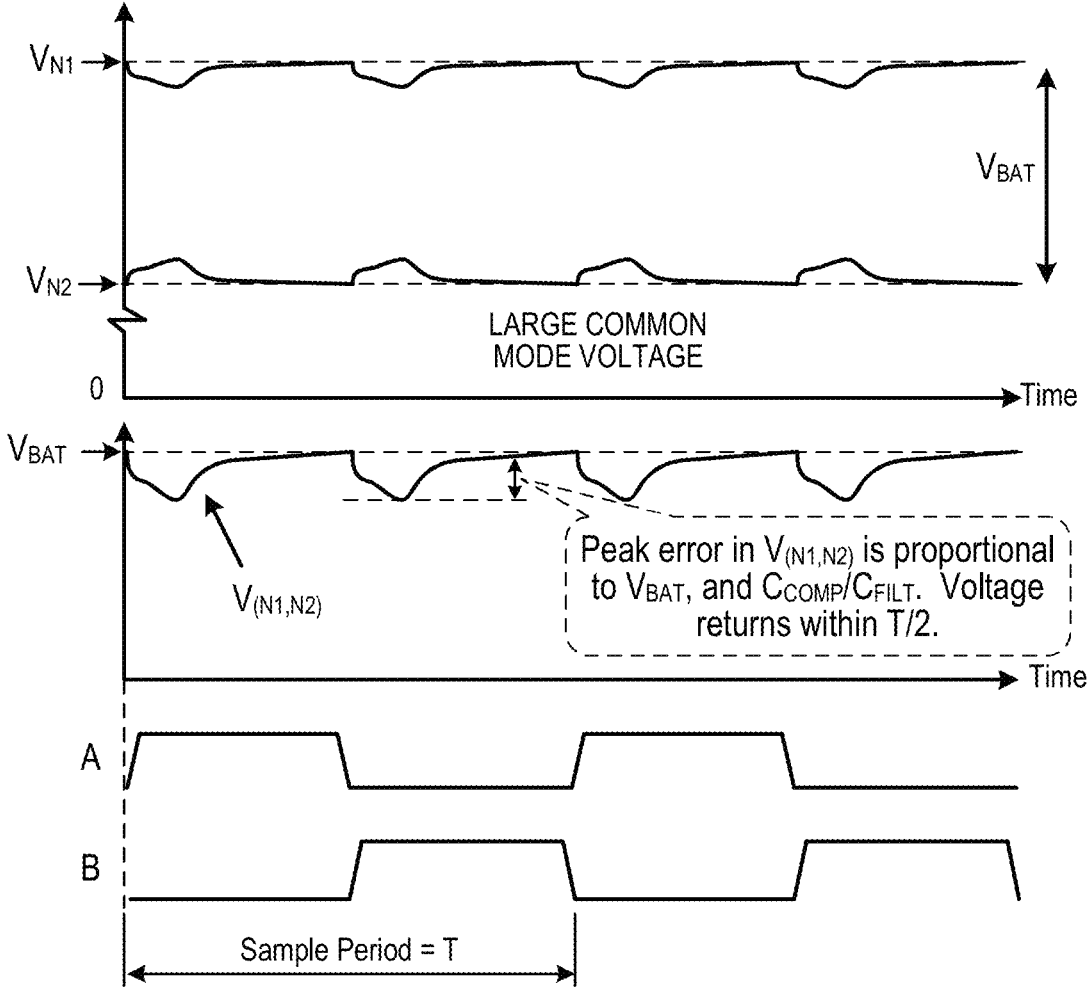
FIG. 20 shows a typical waveform observed at nodes N1 and N2 of the prior art circuit of FIG. 9.

The nodes N1 and N2 experience a temporary disturbance, caused by the initial sampling charges. This disturbance is then canceled as the compensation network switches operate and as the buffer/level-shifter settles. When correctly optimized, the voltage will return to exactly match $V_{BAT}$ at the end of every individual sample period (T/2 for a 2-phase double-sampling design). The amplitude of the excursion from $V_{BAT}$ over the sample period will depend on the value of $V_{BAT}$, increasing approximately proportionally, as $V_{BAT}$ increases. An example waveform is shown in FIG. 20.

Figure 10:
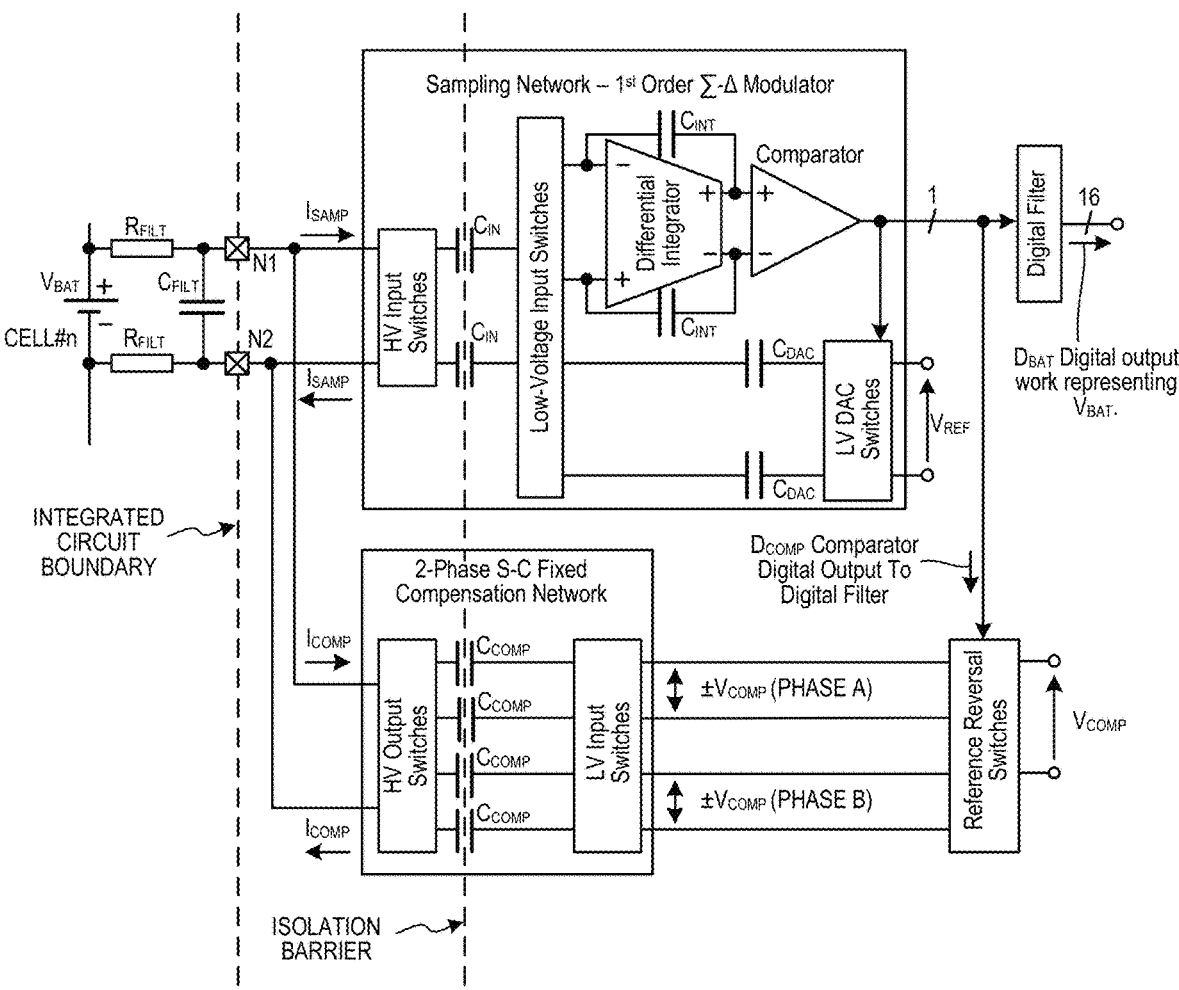
FIG. 10 illustrates prior art where the sensing circuit comprises a switched-capacitor, 1st-order sigma-delta modulator. The modulator's digital bit-stream is used in conjunction with the cancellation switched-capacitor network of FIG. 8, a voltage reversing switch and appropriate timing control to cancel the input current and create a high differential input impedance.
Figure 11:
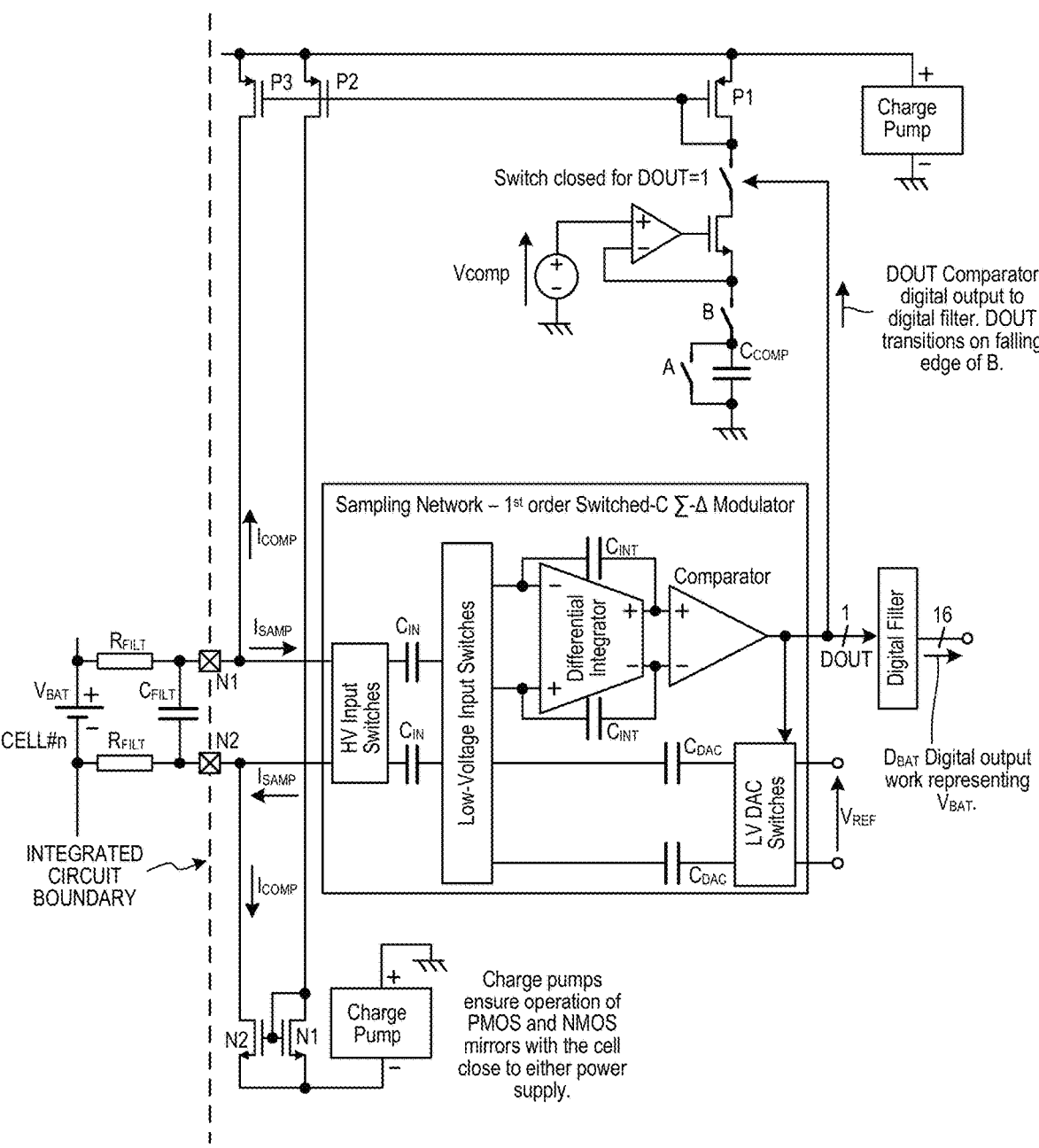
FIG. 11 illustrates prior art which shows an alternative method to achieve high differential input impedance when the sensing circuit is a switched capacitor, 1st order sigma-delta modulator. In this case the modulator bit-stream uses a series of current mirrors to achieve the differential input current injection and cancellation.

When the primary sampling input also forms the input of a sigma-delta converter, then, under certain conditions it becomes possible to use the digital output of the modulator to control the negative current generating circuit. FIG. 10 and FIG. 11 show two prior art examples of this.

Figure 8:
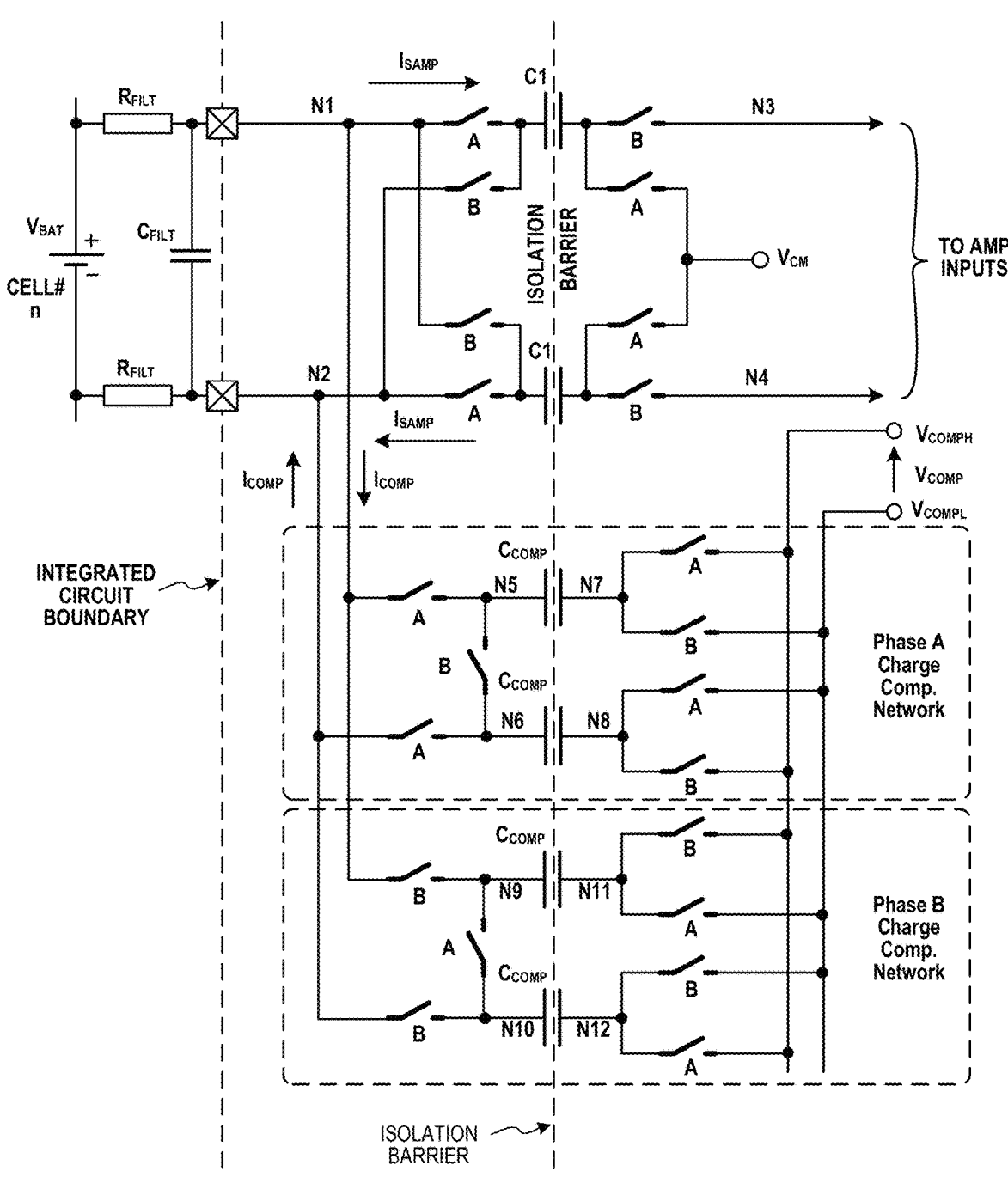
FIG. 8 illustrates an example of prior art where a switched-capacitor network is used to create a compensating, opposing current at the input terminals. With the correct capacitor and compensating voltage values, the differential input charging currents may be completely canceled.
Figure 9:
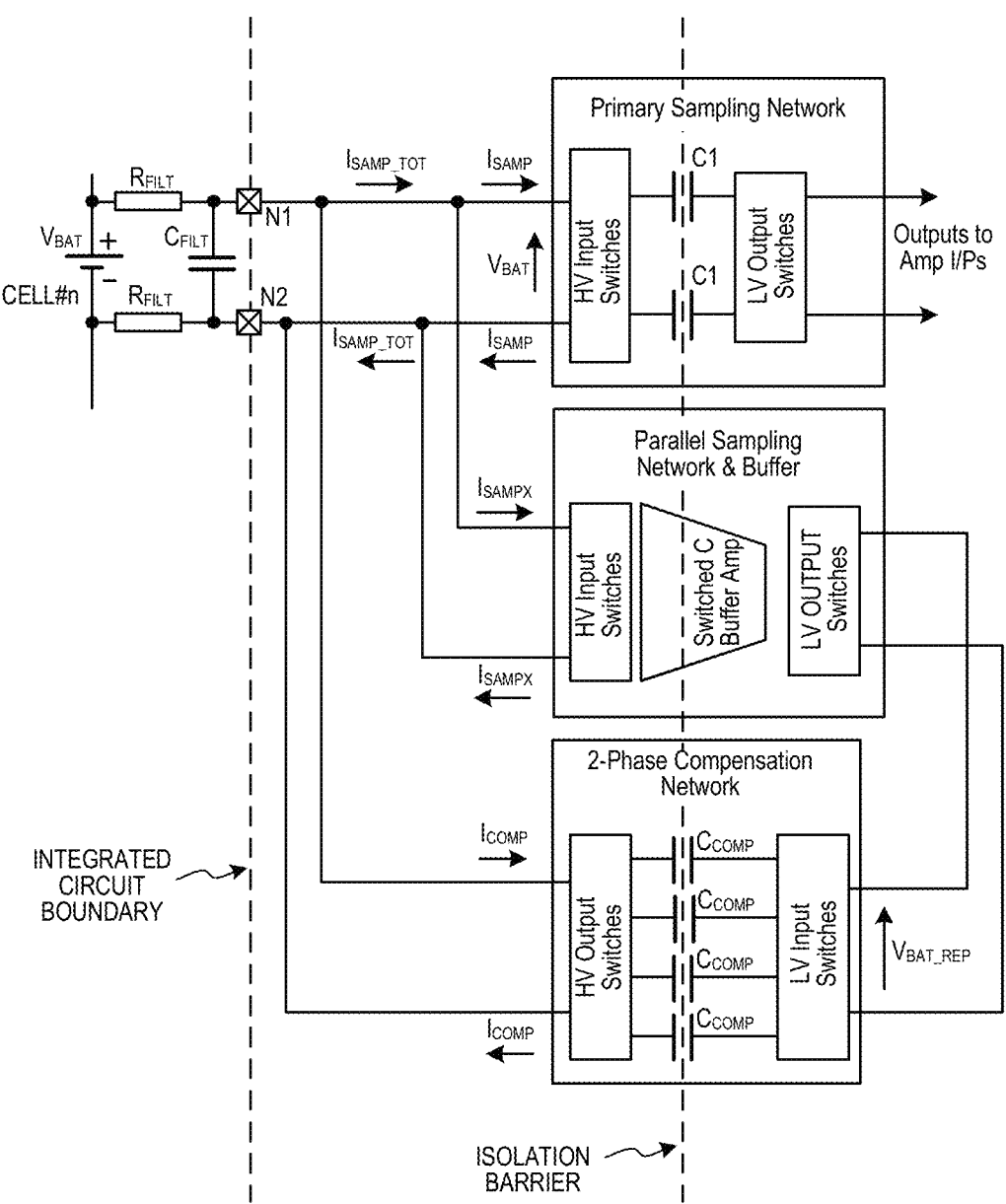
FIG. 9 illustrates prior art where a parallel input sampling path is used to sense the input voltage and then present this to the compensating circuit of FIG. 8 such that the conditions for input current cancellation may be realized over a wide range of input voltage values. This creates the appearance of an infinite differential input impedance for the complete circuit at nodes N1 and N2.

FIG. 10 is a diagram of a prior art circuit in which a switched capacitor network with switches operates at both the high and low voltage sides of the isolation barrier synchronously with the modulator so that the charge is capacitor coupled across the isolation barrier in a manner similar to that illustrated in FIG. 8 and FIG. 9.

FIG. 11 is a diagram of a prior art circuit in which the compensating charge is metered in the low-voltage domain and then mirrored through a series of high-voltage current mirrors to the original inputs. In this example, the isolation barrier is not contained to just capacitors. Additionally charge pumps may be required to ensure the circuit can operate successfully when the battery cell being measured is close to either the positive or negative supply of the sensing circuit. For both the circuits of FIG. 10 and FIG. 11 the compensation level may be adjusted by varying the values of $V_{COMP}$ and $C_{COMP}$. FIG. 10 may be used to compensate a bipolar input, but FIG. 11 is limited to compensating a uni-polar input, unless significant complexity is added in the mirror circuitry at the high-voltage nodes—which is undesirable. The circuit of FIG. 11 has an advantage that the compensating charge injection circuitry does not initially add an extra switched-capacitor load to the input as happens in FIG. 9 and FIG. 10 and so significantly smaller $C_{COMP}$ may be used for any given $V_{COMP}$ saving circuit area. This must be balanced against the larger area required by the additional high voltage current mirrors.

Figure 12:
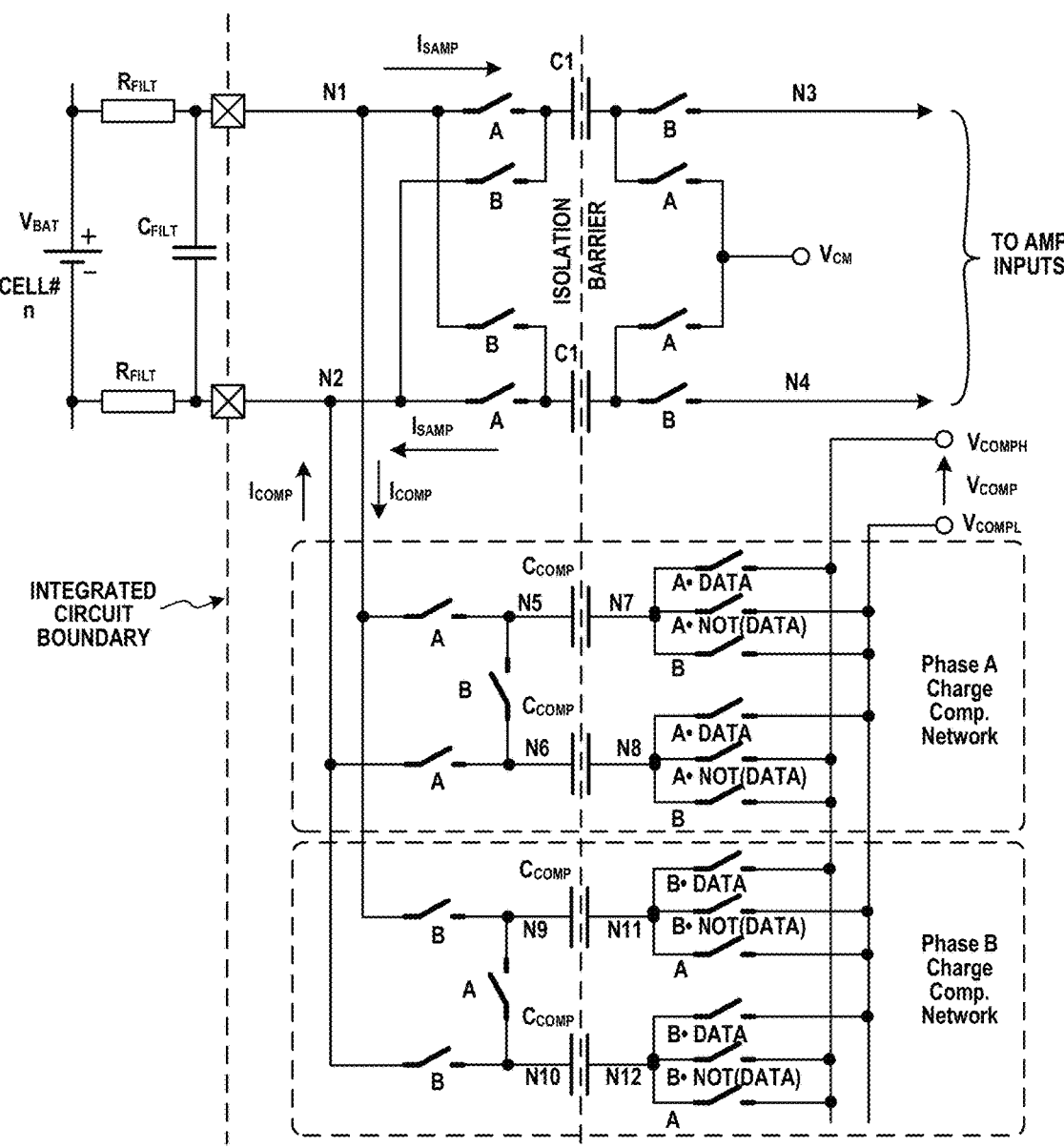
FIG. 12 illustrates an improvement over the compensation circuit of FIG. 8 such that the injected charge may be directly modulated by a synchronized, serial data stream, such that the time averaged compensation current is directly proportional to the average pulse density of the serial data over a finite time interval comprising multiple sample periods.
Figure 17:
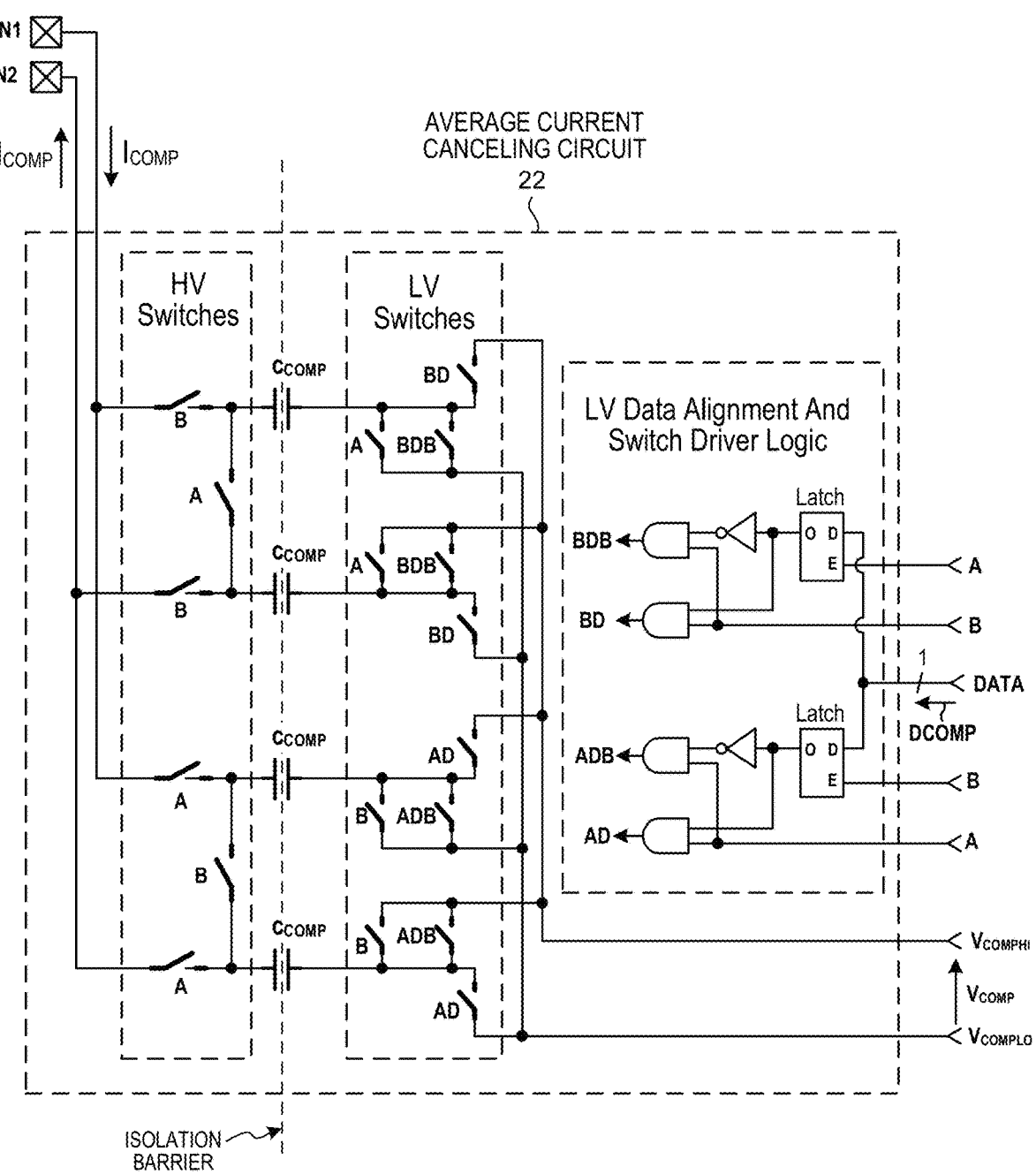
FIG. 17 is a more detailed diagram of the average current canceling circuit 22 of FIG. 16.

FIG. 12 is a diagram of part of a novel current canceling charge injection circuit. This circuit may use a fixed reference voltage for $V_{COMP}$ and a pulse-density modulated synchronous DATA stream to vary the time-averaged level of compensating charge injection in direct proportion to the pulse density of the signal DATA. FIG. 17 shows a more detailed implementation of FIG. 12, including the necessary switch control logic and data alignment for 2-phase operation. If we define a value $D_{COMP}$ (which is allowed to vary between 0 and 1) to represent the time-averaged pulse density of the input signal DATA where 1 represents a continuous stream of all ones and 0 represents a stream of all zeros. This circuit may be described as below:

$$Q_{COMP} = C_{COMP} * (V_{BAT} - 2 * V_{COMP} * D_{COMP}) \qquad \text{(Eq. 18)}$$

$$I_{COMP} = F_{SAMPLE} * C_{COMP} * (V_{BAT} - 2 * V_{COMP} * D_{COMP}) \qquad \text{(Eq. 19)}$$

Figure 13:
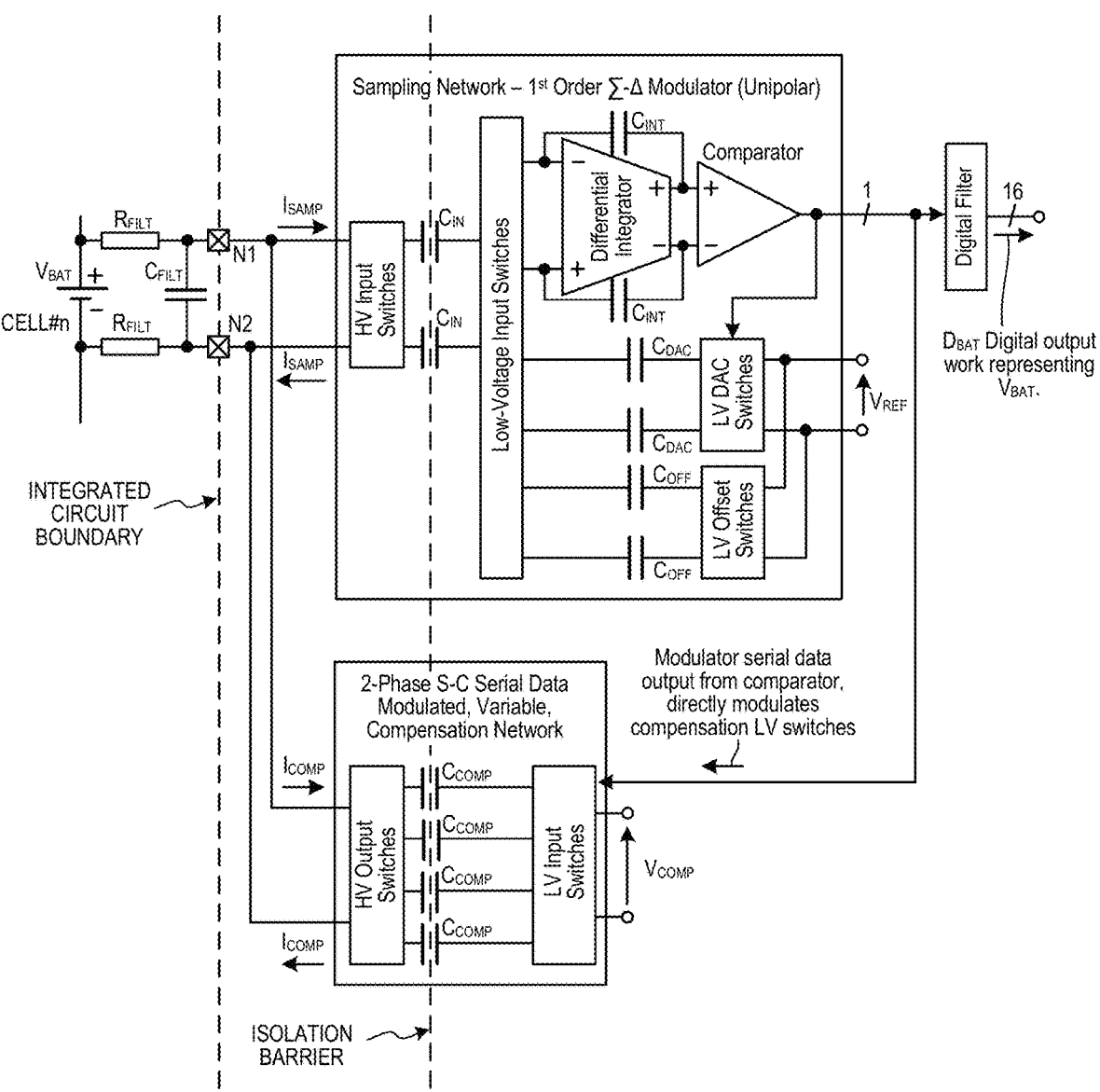
FIG. 13 illustrates how the improved circuit of FIG. 12 may be used to directly compensate the differential input impedance of a voltage sensing circuit, when that sensing circuit comprises a switched capacitor, 1st order sigma-delta modulator with a uni-polar input signal range, effected by using an offset generating, switched-capacitor signal path.

Now, if the DATA pulse stream is sourced synchronously as the digital bit-stream of a delta-sigma modulator as illustrated in FIG. 13, $D_{COMP}$ will be linearly related to the voltage being sensed $V_{BAT}$. We may define this linear relationship using an offset $O_M$ and a gain factor $G_M$ such that:

$$D_{COMP} = G_M * (V_{BAT}) + O_M \qquad \text{(Eq. 20)}$$

The factors $O_M$ and $G_M$, are characteristic properties of the modulator structure and typically relate to the modulator gain and the minimum and maximum modulation density available for the digital data stream. These factors are usually tightly constrained by the modulator order and by its stability, noise and operating range requirements.

The total input current can be generalized as:

$$I_{IN} = F_{SAMPLE} * [V_{BAT} * (2 * C1 + C_{COMP}[1 - 2 * V_{COMP} * G_M]) - \qquad \text{(Eq. 21)}$$
$$2 * V_{COMP} * C_{COMP} * O_M]$$

Importantly, note that with $V_{BAT}=0$, the input current is always overcompensated by the current component related to the minimum modulation value OM by a value of $2*F_{SAMPLE}*V_{COMP}*C_{COMP}*O_M$.

For this to work we must make $O_M=0$. This is not practical for any real modulator because at a modulation factor of 0 the modulator loop would breakdown. Also at modulation values anywhere close to 0 (or to 1) the frequency shaped quantization noise will move into a region in the frequency domain where the (post modulator) low-pass digital decimation filter can no longer reject it. To correct this, more circuitry may be added to introduce an additional fixed positive current to cancel the excess negative cancellation current. This is complex and counter productive.

A better solution is to find a way to transform the modulator's raw data stream into a second, related data stream, with minimal delay, which conveys the same information about the input signal ($V_{BAT}$) but which is more completely (virtually 100%) modulated and therefore more suitable as a drive signal to the switched-capacitor charge cancellation circuit.

Figure 14:
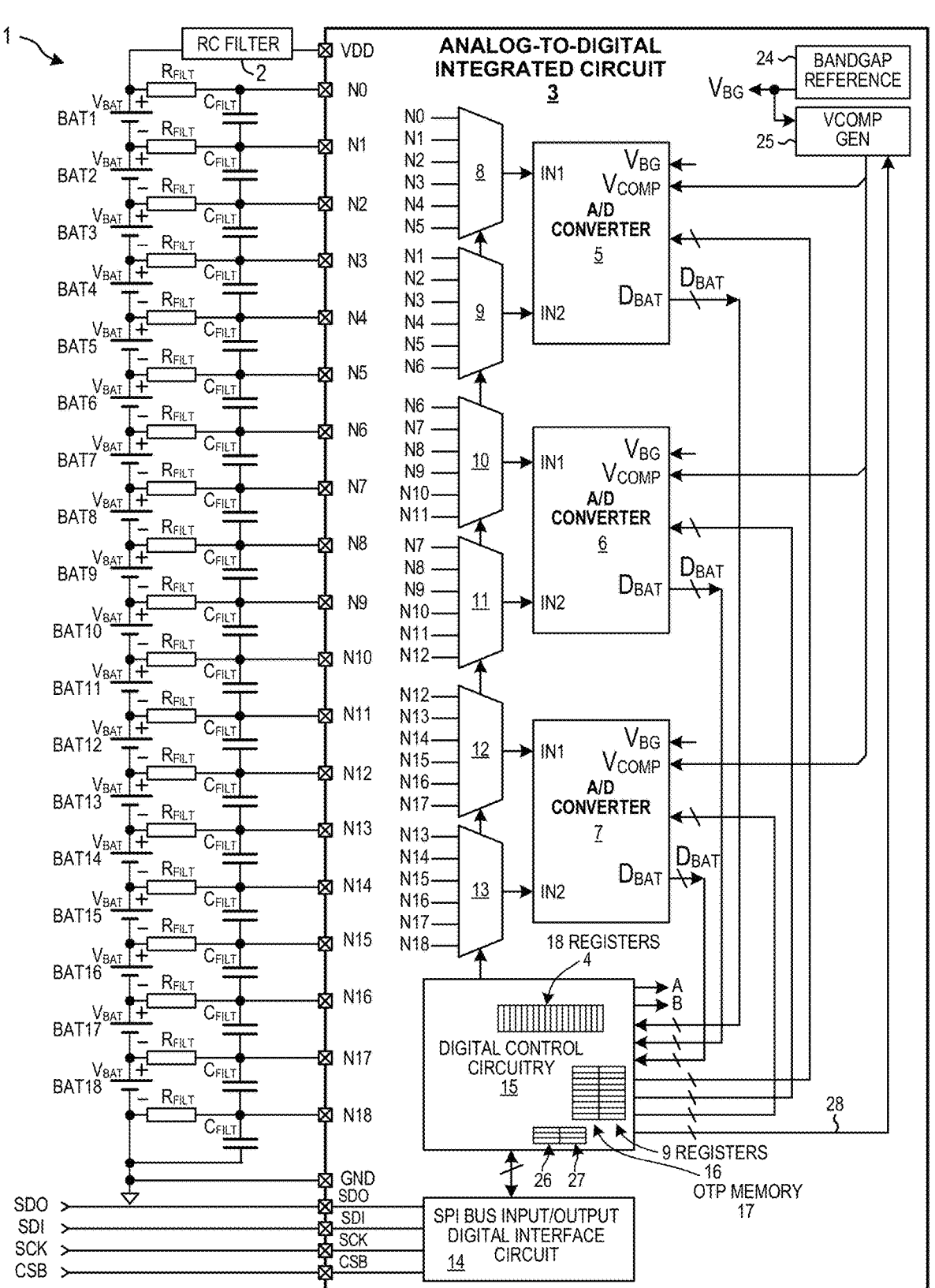
FIG. 14 is a diagram of a circuit 1 including a stack of eighteen batteries connected in series, a set of filter resistors and filter capacitors, and an analog-to-digital converter integrated circuit 3.

FIG. 14 is a diagram of a circuit including 1, a stack of eighteen batteries BAT1-BAT18 connected in series, a set of filter resistors $R_{FILT}$ and filter capacitors $C_{FILT}$, an RC filter 2, and an analog-to-digital converter integrated circuit 3. The batteries may be rechargeable lithium-ion batteries, each of which has a nominal charged voltage of 3.6 volts, and a maximum charged voltage of about 4.2 volts. The resistors may, for example, each have a resistance $R_{FILT}$ that is more than 100 ohms, and each capacitor may have a capacitance $C_{FILT}$ that is greater than 10 nanofarads. The analog-to-digital integrated circuit 3 measures the voltage $V_{BAT}$ of each battery and stores the resulting 16-bit measurement value in a corresponding one of eighteen 16-bit registers 4. Reference numerals N0-N18, VDD, GND, SDO, SDI, SCK and CSB identify integrated circuit terminals. The analog-to-digital converter integrated circuit 3 is powered from the VDD terminal. The supply voltage on the VDD terminal can be as high as 90 volts.

The analog-to-digital converter integrated circuit 3 further includes a first analog-to-digital converter circuit 5 to measure the voltages on each of the upper six batteries, a second analog-to-digital converter circuit 6 to measure the voltages on the middle six batteries, and a third analog-to-digital converter circuit 7 to measure the voltages on the lower six batteries. Each of the analog-to-digital converter circuits 5-7 represented as a block in FIG. 14 includes a differential input voltage sensing circuit, a digital filter that outputs the $D_{BAT}$ value, and an input current cancellation circuit. In the case of the analog-to-digital converter circuit 5 that measures the voltages on the upper six batteries, there is a first six-to-one analog multiplexer 8 that couples a selected one of the voltage input terminals NO-N5 to the input voltage node IN1 of analog-to-digital converter 5, and there is a second six-to-one analog multiplexer 9 that couples another selected one of the voltage input terminals N1-N6 to the input voltage node IN2 of the analog-to-digital converter 5. These analog multiplexers are controlled so as to measure the voltage on the six batteries BAT1-BAT6, one at a time. The analog-to-digital converter circuit 5 can accurately measure the voltage across a battery when there is as much as 100 volts of common-mode voltage (with respect to the ground node at the bottom of the battery stack). Multiplexers 10 and 11 are the multiplexers for the analog-to-digital converter circuit 6. Multiplexers 12 and 13 are the multiplexers for the analog-to-digital converter circuit 7.

The integrated circuit 3 further includes an SPI bus input/output digital interface circuit 14. Circuitry outside the integrated circuit can load multi-bit digital values into the integrated circuit via the SPI bus digital interface 14 such that the corresponding nine values that are loaded into trim registers 16 are in turn supplied to each of the three A/D converters 5, 6 and 7. In this way, each of the three analog-to-digital converters 5, 6 and 7 receives its own set of three 10-bit digital trim values I/P_OFFSET, I/P_GAIN and F/B_GAIN from the digital control circuitry 15. Circuitry outside the integrated circuit can also use the SPI bus digital interface 14 to read the eighteen 16-bit measurement data values stored in the eighteen registers 4. The digital control circuitry 15 outputs multiplexer select control signals that are supplied onto the select input leads of the multiplexers 8-13. If during semiconductor manufacturing the semiconductor manufacturing process varies, then performance parameters of circuit components may vary so that circuit operation is affected and this in turn may result in incomplete cancellation and measurement errors. Advantageously, after integrated circuit manufacture, the analog-to-digital converters 5-7 are calibrated and trimmed, and the resulting digital trim values (I/P_OFFSET, I/P_GAIN, F/B_GAIN) are loaded into the nine trim value registers 16. When the integrated circuit 3 is properly trimmed, the trim values supplied to the analog-to-digital converter 5-7 are fixed by writing the trim values into OTP (one-time programmable) memory 17. The trimmability of the integrated circuit 3 makes the integrated circuit 3 more manufacturable and reduces manufacturing costs. The digital control circuitry 15 also generates and outputs two non-overlapping clock signals A and B.

A bandgap reference voltage circuit 24 supplies a bandgap reference voltage VBG to each of the three analog-to-digital converter circuit 5-7.

In addition to the trim functionality and circuitry described above, the integrated circuit 3 further includes additional trim functionality and circuitry for adjusting a $V_{COMP}$ reference voltage that is supplied to each of the three analog-to-digital converter circuits 5-7. The VCOMP1 reference voltage supplied to analog-to-digital converter circuit 5 is determined and adjusted by a corresponding first 5-bit digital value, the VCOMP2 reference voltage supplied to analog-to-digital converter circuit 6 is determined and adjusted by a corresponding second 5-bit digital value, and the VCOMP3 reference voltage supplied to analog-to-digital converter circuit 7 is determined and adjusted by a corresponding third 5-bit digital value. The three 5-bit values are in 2's compliment form. Circuitry outside the integrated circuit can use the SPI bus digital interface 14 to write these three 5-bit values that are stored in three corresponding addressable 5-bit registers 26 in the digital control circuitry 15. Once the desired 5-bit trim values have been determined and set, these values can then be fixed by writing the 5-bit trim values into fifteen associated bits of OTP memory 27. The three 5-bit trim values in registers 26 of digital control circuitry 15 are supplied by fifteen associated conductors 28 to a VCOMP generator circuit 25. For each 5-bit trim value, the VCOMP generator circuit 25 generates and outputs a corresponding $V_{COMP}$ reference voltage via a pair of conductors to input current cancellation circuitry in the associated one of the analog-to-digital converter circuits 5-7. Increasing the 5-bit trim value increases the voltage $V_{COMP}$ supplied and thereby increases the gain of the input current cancellation circuitry. The overall gain of the input current cancellation circuitry of a given analog-to-digital converter 5-7 is a function of both its associated multi-bit digital trim gain values stored in registers 16 and its associated multi-bit compensation voltage value stored in registers 26.

Figure 15:
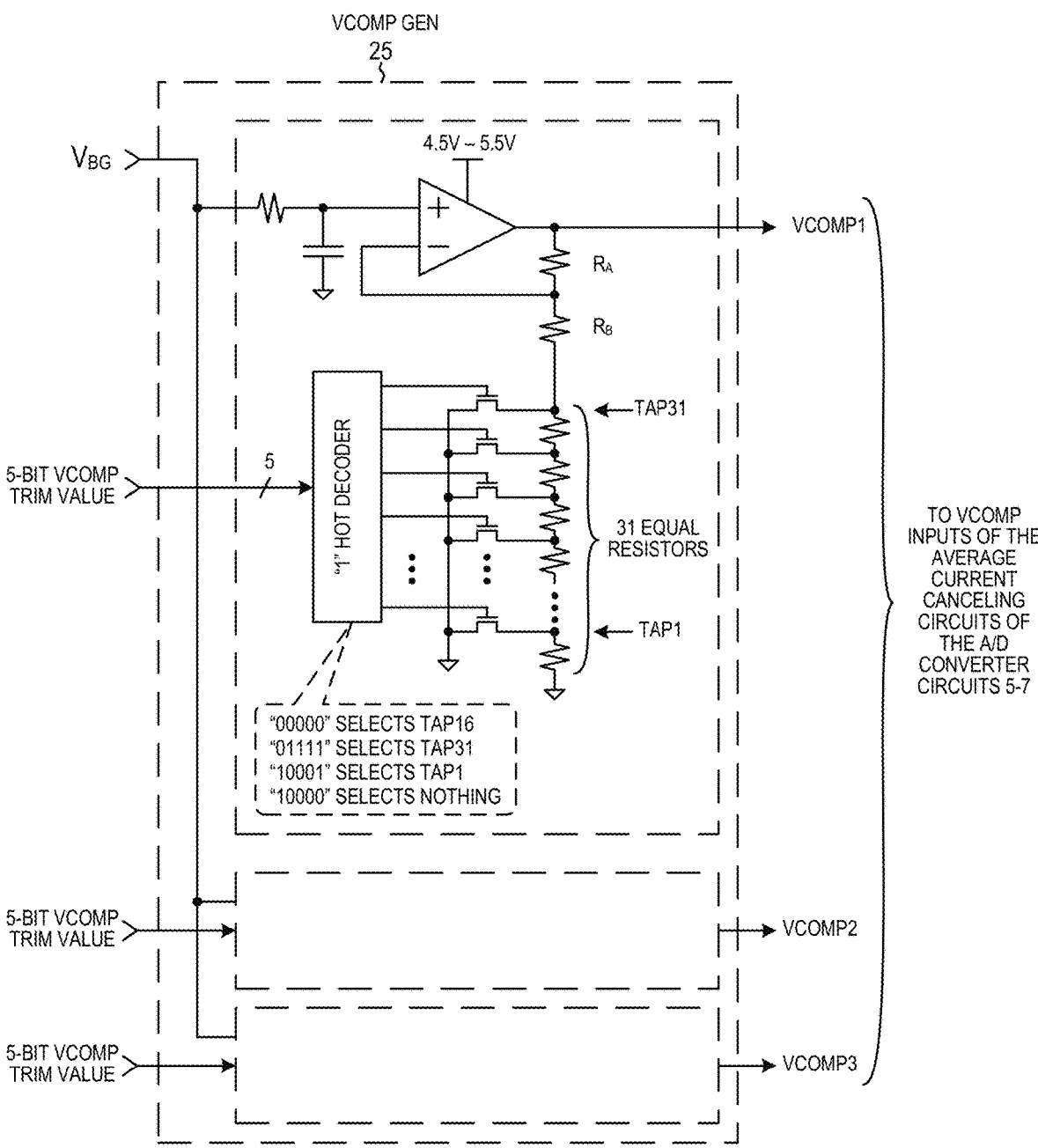
FIG. 15 is a simplified diagram of one example of the circuitry of the VCOMP generator 25 of FIG. 14.

FIG. 15 is a simplified diagram of one example of the VCOMP generator 25 of FIG. 14. A 5-bit code of "01111" gives a maximum gain, a code of "10000" gives a minimum gain, and a code of "00000" gives a nominal gain. The corresponding voltages are approximately 4.537 volts, 4.255 volts, and 4.066 volts (given a 3.2768 input reference voltage $V_{BG}$ received from the bandgap circuit).

FIG. 16 is a diagram of the analog-to-digital converter 5 portion of the overall an analog-to-digital converter integrated circuit 3 in accordance with one embodiment of the invention. The analog-to-digital converter integrated circuit 3 includes two input voltage terminals and corresponding nodes N1 and N2, a voltage sensing circuit 18, a digital filter 19, and an input current cancellation circuit 20. The voltage sensing circuit 18 and the digital filter 19 together comprise a sigma-delta analog-to-digital converter circuit that outputs a multi-bit digital output value $D_{BAT}$. The input current cancellation circuit 20 in the example of FIG. 16 includes a digitally-trimmable digital processing circuit (a digital sigma-delta modulator) 21 and an average current canceling circuit 22.

FIG. 17 is a simplified circuit diagram of an example of the average current canceling circuit 22 of FIG. 16. The circuit is a two-phase, switched capacitor, serial data modulated, variable charge injector. The appropriate one of the VCOMP voltage reference outputs of the VCOMP generator circuit 25 of FIG. 14 is coupled to the $V_{COMPHI}$ input conductor of FIG. 16. The $V_{COMPLO}$ input conductor is coupled to GND. The modulated single-bit digital signal DCOMP from the DMOD$_{OUT}$ output of the digital sigma-delta modulator 21 of FIG. 16 is supplied onto the DATA input lead of FIG. 17. The signals A and B are the non-overlapping clock signals A and B that are generated by the digital control circuitry 15 of FIG. 14.

Figure 18:
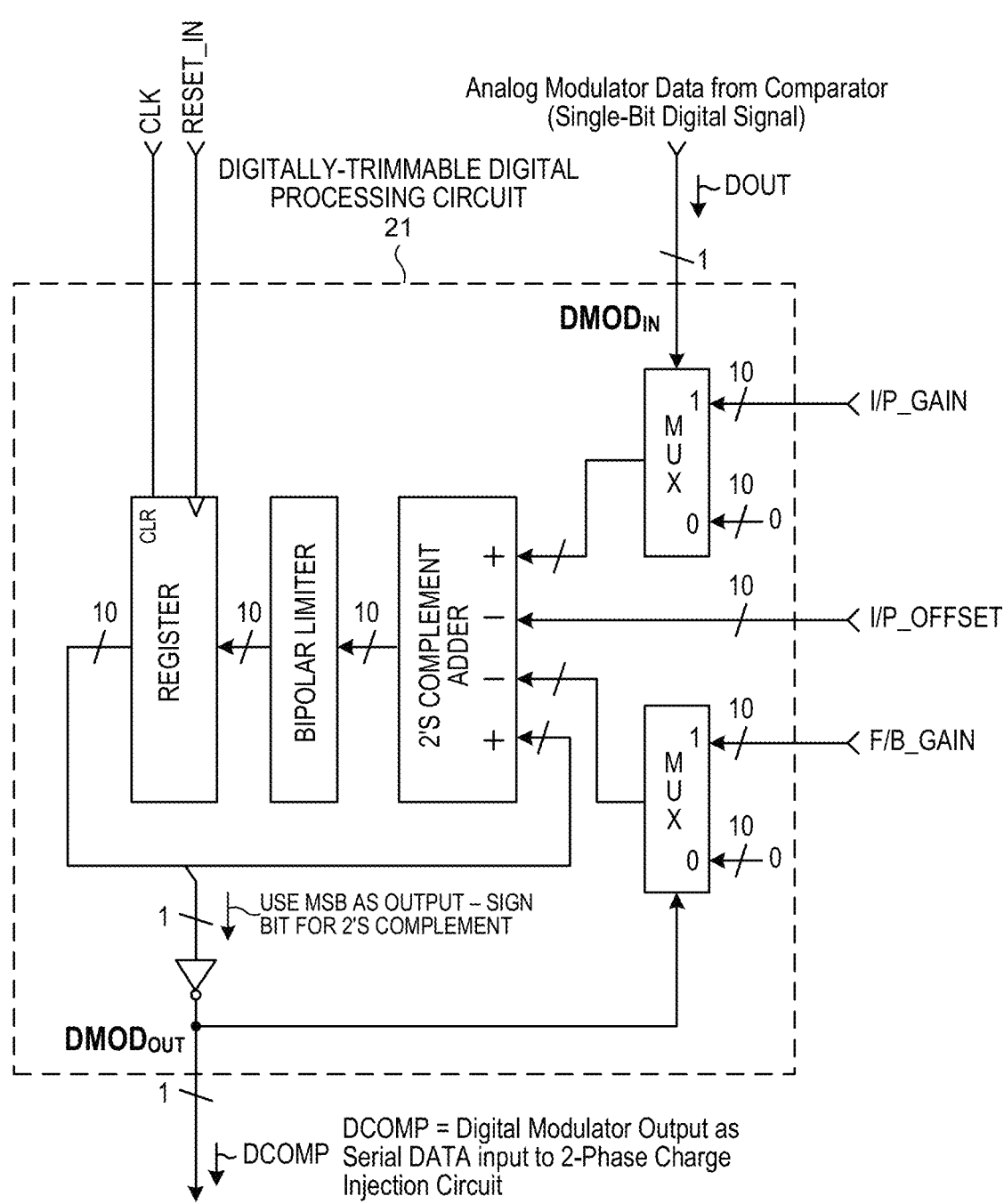
FIG. 18 is a more detailed diagram of the digital sigma-delta modulator circuit 21 of FIG. 16.

FIG. 18 is a simplified circuit diagram of an example of the digitally-trimmable digital processing circuit 21 of FIG. 16. The single-bit digital signal DOUT is received from the voltage sensing circuit 18 of FIG. 16. The modulated single-bit digital signal DCOMP output by the circuit of FIG. 18 is supplied to the average current canceling circuit 22 of FIG. 16.

In the embodiment of FIG. 16, an arbitrary first or higher order analog modulator 23 is used as the primary sampling network (in voltage sensing circuit 18). The single-bit output data stream DOUT is transformed, efficiently, into a deeply pulse-density-modulated, synchronous signal, to drive the compensation network. The additional circuitry is all realized in the digital circuit domain and so, in modern processes—where digital logic is very compact—this solution adds very little circuit area. Furthermore, the parameters determining the characteristics of this new circuit are precisely predictable and may be changed by simply changing coefficient values in the digital logic. This greatly simplifies the process of any necessary trimming that might be required to compensate for component variations in the analog domain.

In the presently described analog-to-digital integrated circuit of FIG. 14, the digital interface terminals include the SDO terminal, the SDI terminal, the SCK terminal, and the CSB terminal. The digital interface circuit 14 (see FIG. 14) that is coupled to these terminals implements an SPI serial bus interface. This SPI serial bus interface 14 is usable to load into the integrated circuit a 10-bit digital input offset (I/P_OFFSET) value, a 10-bit digital input gain (I/P_GAIN) value, and a 10-bit digital feedback gain (F/B_GAIN) value. When the analog-to-digital integrated circuit is being tested at the final test stage of integrated circuit production, a known input voltage is supplied onto the voltage input terminals and the error is observed. The values for I/P_OFFSET and I/P_GAIN are then adjusted by loading new I/P_OFFSET and I/P_GAIN values into the integrated circuit via the digital interface circuit so as to change the transfer function of the overall input current cancellation circuit. The new error is then observed. This sequence of adjusting the trim values and observing the resulting error is carried out multiple times in order to determine the desired trim values. Once the desired trim values have been determined and have been loaded into the integrated circuit, they are then programmed into the fuse-type OTP (One Time Programmable) memory 17 of the digital interface circuit 14.

In the presently described analog-to-digital integrated circuit of FIG. 16, the decimation digital filter may be a sin c filter. In one example in which the decimation digital filter is a third-order sin c filter, the sin c filter involves a cascade of three digital integrators, a digital sample and hold circuit, and a cascade of three digital differentiators. The digital integrators are clocked at the same data rate as the analog modulator, and the digital sample and hold circuit and the digital differentiators are clocked at the desired output data rate.

The analog-to-digital integrated circuit 3 of FIG. 16 differs from the circuits of FIG. 13, FIG. 10 and FIG. 11 because it includes a digital sigma-delta modulator in the input current compensation loop, and because the transfer function of the input current compensation circuit is digitally programmable.

To achieve high depths of modulation at its output, a first-order sigma-delta modulator is used and includes a digital integrator that has its output range limited. The limiting function serves to improve the transient settling and recovery times of the compensation loop and to allow it to rapidly respond to changes in the battery voltage $V_{BAT}$ or to the start of voltage sensing when initiated from an idle state. An optional RESET may be used to further improve transient settling of the loop when a measurement starts. The illustrated first-order digital modulator shown is not the only possible implementation. Other implementations may split the summation of the inputs and the integration function into multiple separate adders and might also use number representations other than the 2's compliment format illustrated. The blocks shown as MUXes may also be implemented as AND functions.

In the implementation of the digitally-trimmable digital processing circuit 21 of FIG. 18, the incoming signal DMO-$D_{IN}$ is the single-bit input signal DOUT bit stream received from the voltage sensing circuit 18 of FIG. 16. The signal CLK may, for example, be the clock signal CLKA. Each of the two multiplexer symbols at the right of the diagram represents a 10-bit, two-to-one multiplexer. The bipolar limiter receives a 10-bit digital value and outputs that same 10-bit value to the register, unless the incoming value is greater (a larger positive number) than a predetermined maximum positive value, in which case the bipolar limiter outputs that predetermined maximum positive value. If the incoming value is more negative (a larger negative number) than a predetermined maximum negative value, then the bipolar limiter outputs the predetermined negative value. The register symbol represents a 10-bit register. The MSB of the 10-bit value as output from the register is a sign bit, indicating whether the value is a positive value or a negative value. The single-bit signal DMOD$_{OUT}$ is an inverted version of the sign bit.

Figure 19:
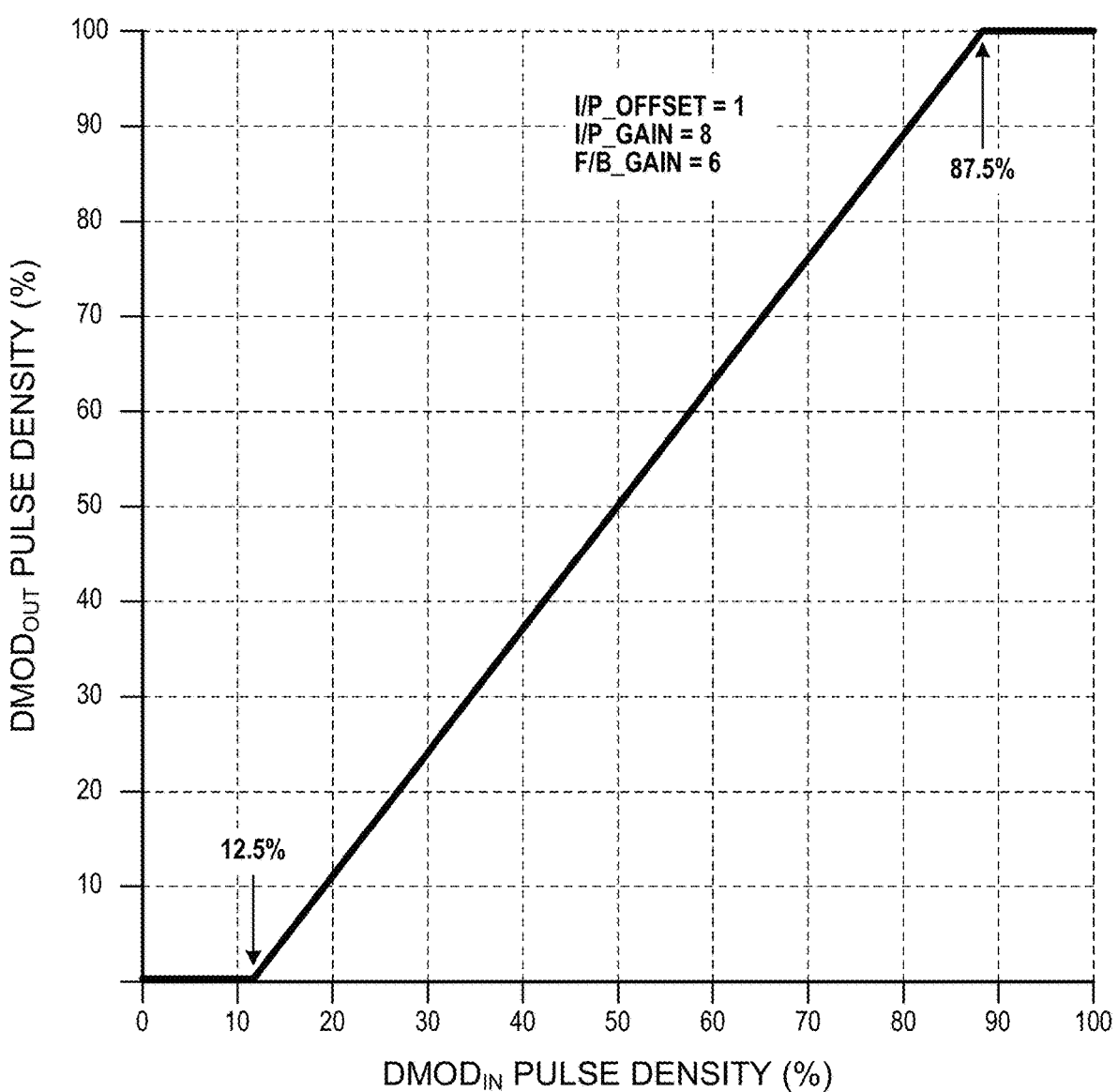
FIG. 19 is a plot that shows the input-to-output data stream pulse-density transformation that is achieved by the digital sigma-delta modulator of FIG. 18 with a chosen set of coefficients applicable to an analog modulator which produces a 12.5% pulse density at 0V differential input voltage and 87.5% pulse density at the desired full-scale input voltage. Such characteristics are common to a uni-polar input, range optimized, 2nd order, analog modulator.

When the last registered value of the integrator is a positive value, a feedback gain value of F/B_GAIN is subtracted on the next active clock edge so as to reduce the next value of the integrator. When the last value of the integrator is negative, a feedback value of 0 is added to the integrator instead. On each active clock edge, a value equal to the value of I/P_OFFSET is subtracted from the integrator. Finally on each active clock edge, a value of either I/P_GAIN or 0 is added to the integrator depending on the state of the input from the analog modulator DMOD$_{IN}$. When DMOD$_{IN}$ is 1 then I/P_GAIN is added, whereas when DMOD$_{IN}$ is 0, then 0 is added. If I/P_GAIN has a value of eight, and if I/P_OFFSET has a value of 1, and if F/B_GAIN has a value of six, then the pulse-density transformation between DMOD$_{IN}$ and DMOD$_{OUT}$, as illustrated by FIG. 19, is observed.

The negative feedback in the modulator attempts to maintain the integrator value at 0. In this example, the value of F/B_GAIN is less than that of I/P_GAIN. As a result, the pulse density of the signal DMOD$_{OUT}$ (D$_{DMODOUT}$) will increase more rapidly as the pulse density of the signal DMOD$_{IN}$ (D$_{DMODIN}$) increases. The pulse-density transfer function is given by:

$$D_{DMODOUT}=\text{limit}(1,0,[(\text{``}I/P\_GAIN\text{''}*D_{DMODIN}+\text{``}I/P\_OFFSET\text{''})/\text{``}F/B\_GAIN\text{''}]) \quad \text{(Eq. 22)}$$

Here the limit function constrains pulse density to a maximum of 1 (all ones) and a minimum of 0 (all zeros).

In the circuit of FIG. 18, when the value of the pulse density of DMOD$_{IN}$ (D$_{DMODIN}$) is in the regions which cause the output pulse density of DMOD$_{OUT}$ (D$_{DMODOUT}$) to become limited to either all ones or all zeros, the integrator would naturally drift to an unbounded value, and the modulator feedback loop is essentially opened. It is in this region that operation of the bipolar limiter becomes important and now operates to set well defined minimum and maximum integrator values. This prevents any problem that might be caused by the integrator's digital value "wrapping" due to a finite word-width limitation. The limiting of the integrator value also ensures that when the modulator input returns into a region that is no longer causing the modulator to saturate, the integrator value will return to a value close to zero within a small number of clock cycles. This improves the transient setting of the modulator and allows the compensation loop to respond quickly to changes in input voltages and the corresponding current. A balance must be chosen between settling time and the normal range of operation of the modulator's integrator values.

The coefficients and transfer function of FIG. 19 are close to ideal when using a typical uni-polar input range, second order sigma-delta modulator, as the primary voltage sensing circuit. In this case the input range of the converter may be offset using a switched capacitor network such that with a 0V differential input voltage a pulse density of 12.5% (D$_{DMODIN}$=0.125) is generated at the modulator digital output. The gain of the modulator is set such that at the desired full-scale input voltage a pulse density of 87.5% (D$_{DMODIN}$=0.875) is returned. These minimum and maximum pulse densities ensure that the quantization noise remains in frequency regions that are adequately rejected by a simple third-order sin c decimation filter.

The digital modulator advantageously transforms the output digital data stream (DOUT in FIG. 16) of the original analog modulator 23 of the voltage sensing circuit 18 into a new compensation digital data stream (DCOMP in FIG. 16) which exhibits 100% pulse density at full-scale input (V$_{BATMAX}$) and 0% pulse density at 0V. This action both removes the issue of excess input charge compensation at 0V (since the compensation data pulse-density is now zero at this input value) and also allows the minimum value of V$_{COMP}$ to be used—since the compensation data pulse-density is now one at the full-scale input voltage. The digital modulator operates at the analog modulators sample rate, so there is very little delay in the current compensation path back to the input RC filter. The exact delay depends on the analog modulator coefficients, but is typically a few clock cycles at the analog modulator clock rate. This is very much faster than if the circuit were to have to wait for a fully decimated conversion in order to determine the value of V$_{BAT}$. (involving a delay of perhaps several hundreds of analog modulator clock cycles).

Minimizing the necessary value of V$_{COMP}$ is important if V$_{COMP}$ must be generated in the low voltage circuitry. However, if V$_{COMP}$ can be generated in the high voltage domain then there is an additional freedom to reduce the value of C$_{COMP}$ and thereby reduce the circuit area. The reader will recall Equation 21 and with the digital modulator in the compensation loop and at the maximum input voltage V$_{BATMAX}$ where D$_{DMODOUT}$=1, we may now set the values of O$_M$ to 0 and G$_M$ to 1/V$_{BATMAX}$. This yields:

$$\max(I_{IN}) = \quad \text{(Eq. 23)}$$
$$F_{SAMPLE} * V_{BATMAX} * (2 * C1 + C_{COMP}[1 - 2 * V_{COMP} / V_{BATMAX}])$$

If we set I$_{IN}$ to 0 then we may solve either for C$_{COMP}$ with a given V$_{COMP}$:

$$C_{COMP} = 2C1 / (2 * V_{COMP} / V_{BATMAX} - 1) \quad \text{(Eq. 24)}$$

Or for $V_{COMP}$ with a given $C_{COMP}$:

$$V_{COMP} = V_{BATMAX} * (2C1 + C_{COMP} / (2 * C_{COMP}) \quad \text{(Eq. 25)}$$

Note that in both cases when we set V$_{COMP}$=V$_{BATMAX}$ then C$_{COMP}$=2*C1. This is the exact same result achieved in Equation 17 for the circuit of FIG. 9. However, here we have the flexibility to adjust V$_{COMP}$ to easily change the ratio of $C_{COMP}$ to C1 should we wish to do so. A higher $V_{COMP}$ may be used to enable a reduction in the size of $C_{COMP}$ perhaps necessary to save area. Alternatively, a lower $V_{COMP}$ may be used along with a higher $C_{COMP}$ wherever that may be more advantageous.

Figure 21:
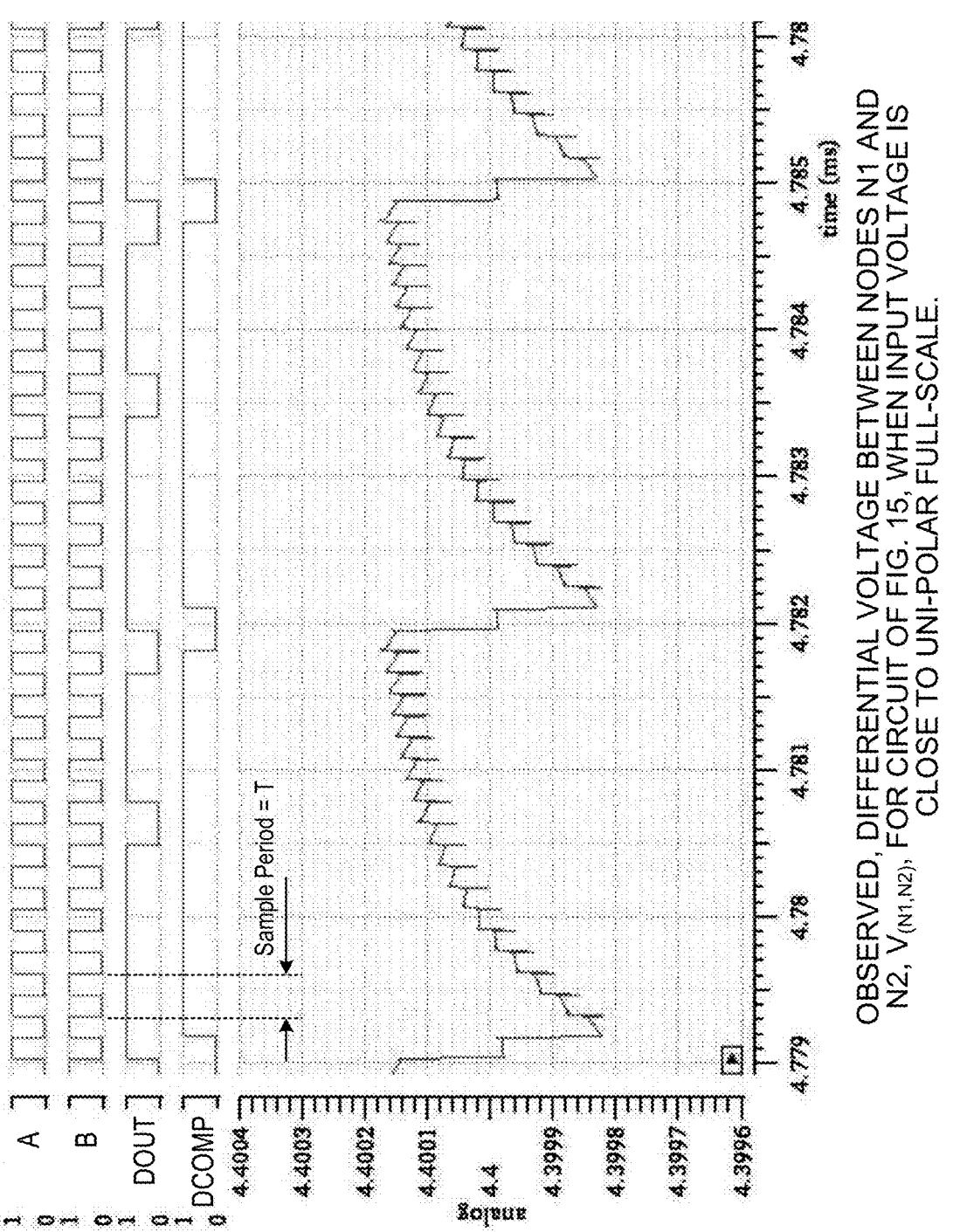
FIG. 21, FIG. 22 and FIG. 23 are diagrams that show typical waveforms observed at nodes N1 and N2 of the novel circuit of FIG. 16 for different differential input voltages, relative to the available input range.
Figure 22:
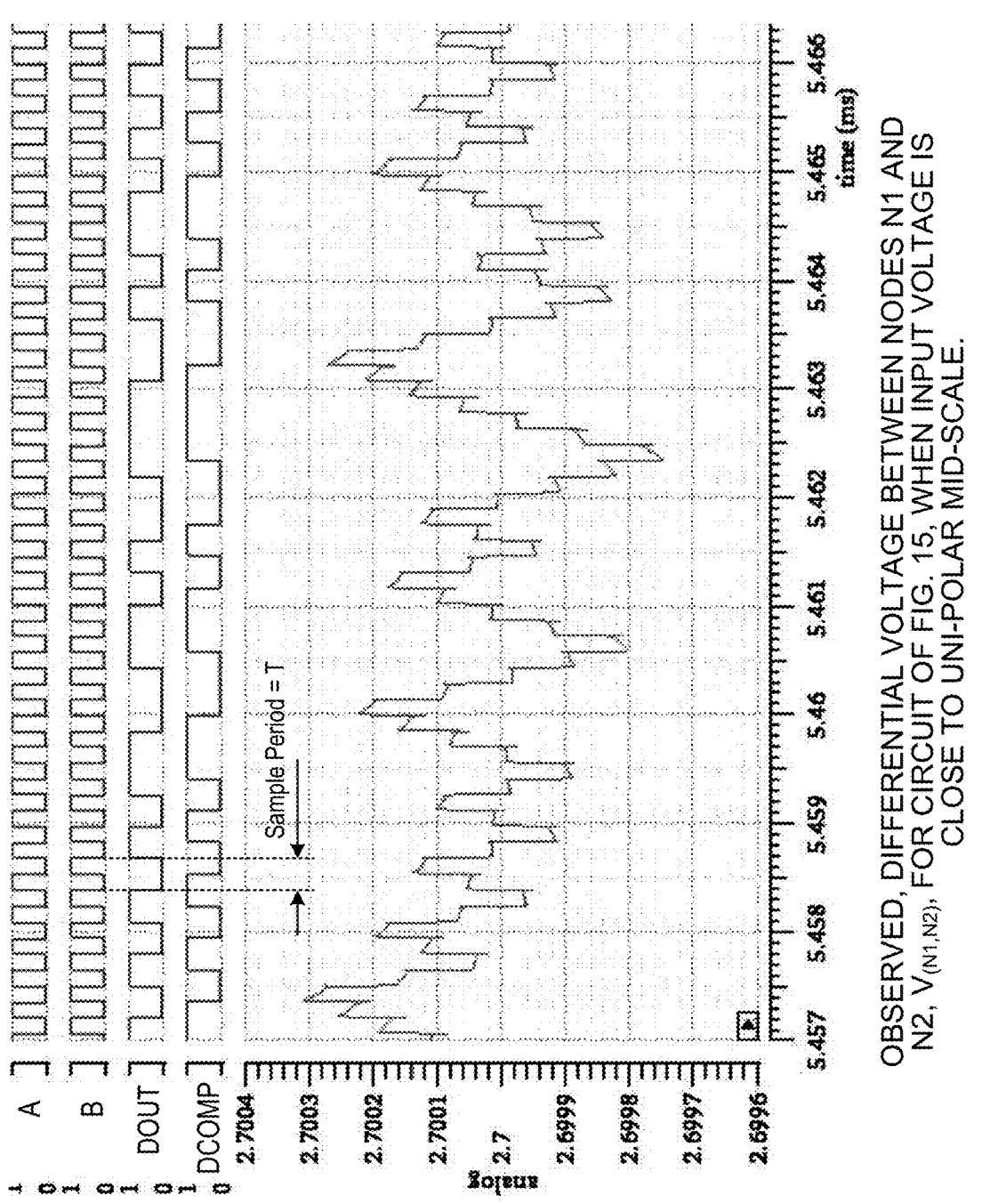
Figure 23:
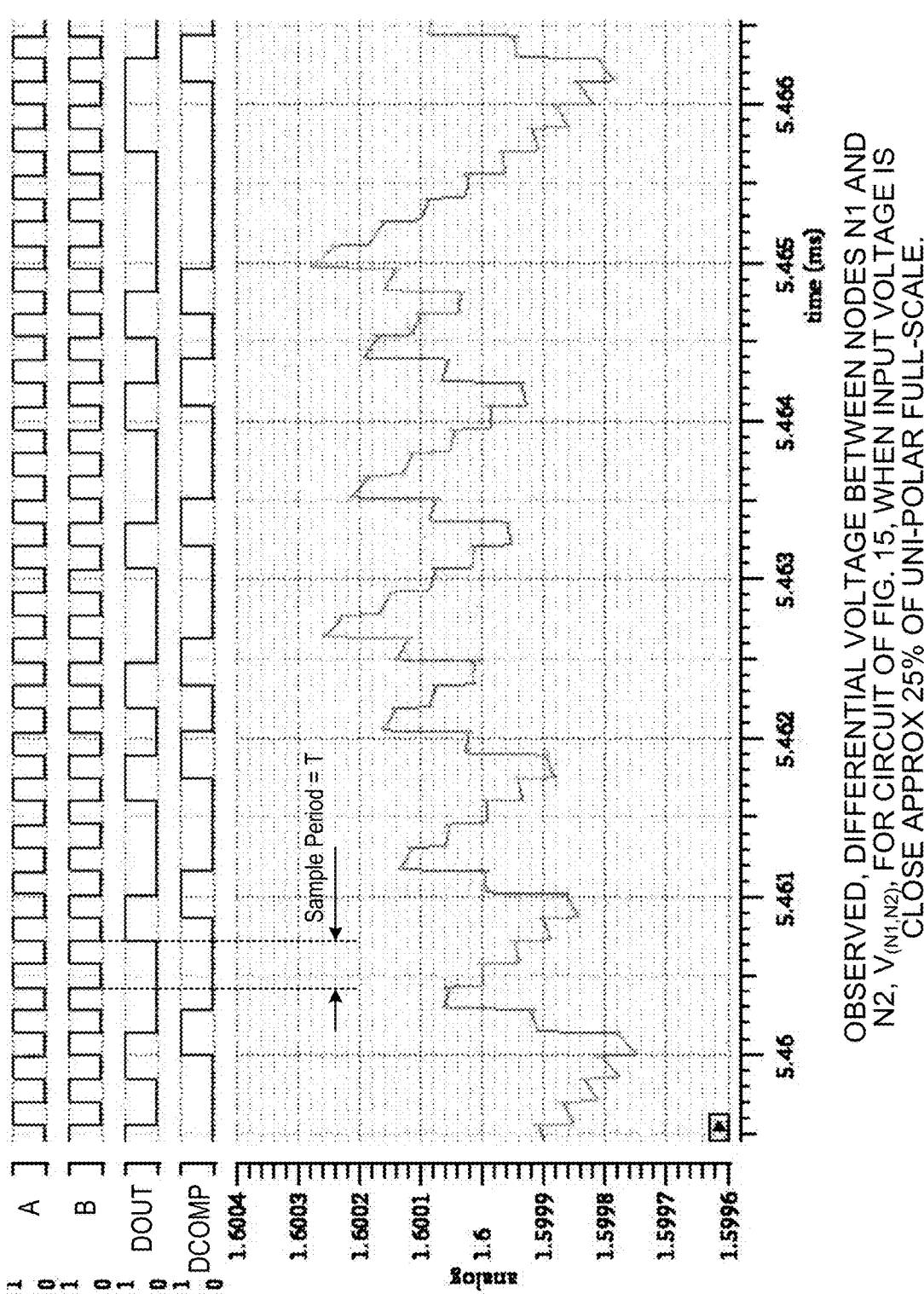

FIG. 21, FIG. 22 and FIG. 23 show how the voltage observed between nodes N1 and N2 is modulated by the input current compensation circuit 20 in response to the DCOMP control signal. It may be noted we remove the requirement that the value of $V_{(N1,N2)}$ be restored to $V_{BAT}$ in T/2. Now, only the average value of $V_{(N1,N2)}$ over a longer time period, matches the applied input voltage $V_{BAT}$. Three cases are shown for circuit operation with an input operating range of 0V to 5V and at $V_{BAT}$ values of 1.6V, 2.7V and 4.4V. The peak-to-peak amplitude of this modulation is a function of the ratio of $C_{COMP}$ to $C_{FILT}$. Larger $C_{FILT}$ will reduce the modulation signal amplitude. In the waveform diagrams of FIG. 21, FIG. 22 and FIG. 23, the signals A and B are the non-overlapping clock signals A and B generated by the digital control circuitry 15 of FIG. 14.

In one example, the analog-to-digital converter with the novel input current cancellation circuit is distinguished from prior art circuits in that there is a small voltage signal present on the input terminals (for example, N1 and N2 of FIG. 14), for example when a battery is being measured from these terminals. This voltage signal has a spectral component at a frequency lower than the frequency of the sample rate (the frequency of non-overlapping sample signals A and B), and that spectral component has an amplitude that is larger than the amplitude of any spectral component (of the voltage signal) of the sample rate frequency or higher. In prior art similar circuits of the type that generate signals of the type illustrated in FIG. 20, there is no substantial spectral component (of the voltage signal present on the input terminals) at a frequency lower than the sample rate frequency.

In summary, the introduction of the digital modulator into the compensation loop enables a sampling input current compensation circuit (FIG. 16) that is at least as effective as the, prior art, analog equivalents (FIG. 9 through FIG. 13) but which now has the significant advantages of: (1) No need for a parallel input sampling network or buffer structure in the compensation path. (2) A simple 2-phase switched-capacitor differential charge injection circuit with serial pulse-density modulation may be used. (3) May be used with any analog sigma-delta modulator, of any order, as the primary sensing circuit. (4) Has a low area overhead due to the digital implementation of the extra modulator. (5) May be easily trimmed in the digital domain by simply changing the digital coefficient values of the digital modulator. (6) Allows flexibility to reduce or increase the size of the compensation capacitors $C_{COMP}$ by means of a simple trade-off between a DC voltage, $V_{COMP}$ and the size of $C_{COMP}$.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:
1. An integrated circuit, comprising:
a first node;
a second node;

an analog-to-digital circuit, comprising:
a differential input, voltage sensing circuit that senses a voltage between the first node and the second node, and that outputs a multi-bit digital output value indicative of the voltage, wherein the voltage sensing circuit conducts a first current between the voltage sensing circuit and the first node as the analog-to-digital circuit performs analog-to-digital conversions, wherein the voltage sensing circuit conducts a second current between the voltage sensing circuit and the second node as the analog-to-digital circuit performs analog-to-digital conversions, and wherein the voltage sensing circuit comprises a sigma-delta modulator circuit; and
an input current cancellation circuit that is coupled to the first node and to the second node, wherein the input current cancellation circuit conducts a third current between the input current cancellation circuit and the first node to cancel substantially the first current, wherein the input current cancellation circuit conducts a fourth current between the input current cancellation circuit and the second node to cancel substantially the second current, and wherein the input current cancellation circuit receives a multi-bit digital gain trim value.

2. The integrated circuit of claim 1, wherein the sigma-delta modulator circuit of the voltage sensing circuit outputs a single-bit digital bit stream, wherein the voltage sensing circuit further comprises a digital filter, and wherein the digital filter receives the single-bit digital bit stream and generates therefrom the multi-bit digital output value.

3. The integrated circuit of claim 1, wherein the input current cancellation circuit further receives a multi-bit digital offset trim value.

4. The integrated circuit of claim 3, further comprising:
a digital interface circuit through which the multi-bit digital gain trim value and the multi-bit digital offset trim value can be loaded into the integrated circuit.

5. The integrated circuit of claim 2, wherein the sigma-delta modulator circuit of the voltage sensing circuit outputs a single-bit digital bit stream, wherein the input current cancellation circuit comprises a digital sigma-delta modulator circuit that receives the single-bit digital bit stream from the voltage sensing circuit, and wherein the multi-bit digital gain trim value is supplied to the digital sigma-delta modulator circuit.

6. The integrated circuit of claim 5, wherein the input current cancellation circuit further comprises a digital input, differential output, average current canceling circuit that receives a modulated single-bit digital bit stream that is output from the digital sigma-delta modulator circuit of the input current cancellation circuit.

7. The integrated circuit of claim 6, wherein the input current cancellation circuit further receives a multi-bit compensation voltage value, wherein the multi-bit compensation voltage value is supplied to the average current canceling circuit.

8. The integrated circuit of claim 1, wherein the input current cancellation circuit receives a compensation voltage, wherein the magnitude of the compensation voltage is adjustable and is at least in part determined by a multi-bit compensation voltage value, the integrated circuit further comprising:
one or more first digital registers that store the multi-bit digital gain trim value;
one or more second digital registers that store the multi-bit compensation voltage value; and a digital interface circuit through which the multi-bit digital gain trim value stored in the one or more first digital registers can be changed, and through which the multi-bit compensation voltage value stored in the one or more second digital registers can be changed.

9. The integrated circuit of claim 1, further comprising:
a first terminal;
a first analog multiplexer coupled to supply a voltage on the first terminal onto the first node;
a second terminal; and
a second analog multiplexer coupled to supply a voltage on the second terminal onto the second node.

10. An integrated circuit comprising:
a first voltage input terminal;
a second voltage input terminal;
an analog-to-digital converter circuit that senses a voltage between the first voltage input terminal and the second voltage input terminal, and that outputs a multi-bit digital output value indicative of the voltage, wherein the analog-to-digital converter circuit has a first voltage input node and a second voltage input node;
an input current cancellation circuit that is coupled to the first and second voltage input nodes of the analog-to-digital converter circuit, wherein the input current cancellation circuit has a gain that is at least in part determined by a multi-bit digital gain trim value, wherein the gain of the input current cancellation circuit is at least in part determined by a multi-bit compensation voltage value;
one or more first digital registers that store the multi-bit digital gain trim value;
one or more second digital registers that store the multi-bit compensation voltage value;
a plurality of digital interface terminals;
a digital interface circuit usable to change the multi-bit digital gain trim value stored in the one or more first digital registers, and usable to change the multi-bit compensation voltage value stored in the one or more second digital registers; and
a compensation voltage generator circuit that outputs a compensation voltage that is supplied to the input current cancellation circuit, wherein the magnitude of the compensation voltage as supplied to the input current cancellation circuit is trimmable by changing the multi-bit compensation voltage value stored in the one or more second digital registers.

11. The integrated circuit of claim 10, wherein the input current cancellation circuit comprises a digital processing circuit portion and an average current canceling circuit portion, wherein the multi-bit digital gain trim value is supplied to the digital processing circuit portion, and wherein the compensation voltage is supplied to the average current canceling circuit portion.

12. The integrated circuit of claim 11, wherein the digital processing circuit portion comprises a digital sigma-delta modulator.

13. The integrated circuit of claim 11, wherein the average current canceling circuit portion comprises a switched-capacitor, serially-modulated, charge injector.

14. The integrated circuit of claim 10, wherein the analog-to-digital converter circuit draws a first current from the first voltage input node as the analog-to-digital circuit performs analog-to-digital conversions, wherein the analog-to-digital converter circuit outputs a second current to the second voltage input node as the analog-to-digital circuit performs analog-to-digital conversions, wherein the input current cancellation circuit supplies a first average current onto the first voltage input node so that substantially no current passes into or out of the integrated circuit via the first voltage input terminal as the analog-to-digital converter circuit performs analog-to-digital conversions, and wherein the input current cancellation circuit draws a second average current from the second voltage input node so that substantially no current passes into or out of the integrated circuit via the second voltage input terminal as the analog-to-digital converter circuit performs analog-to-digital conversions.

15. A method comprising:
(a) storing a multi-bit digital gain trim value in one or more first digital registers on an integrated circuit;
(b) storing a multi-bit compensation voltage value in one or more second digital registers on the integrated circuit;
(c) using an analog-to-digital converter of the integrated circuit to sense a voltage between a first voltage input node of the integrated circuit and a second voltage input node of the integrated circuit, and outputting a multi-bit digital output value from the analog-to-digital converter that is indicative of the voltage sensed; and
(d) using an input current cancellation circuit to generate input current cancellation currents and to conduct the input current cancellation currents between the input current cancellation circuit and the first and second voltage input nodes, wherein the input current cancellation circuit has a gain that is a function of both the multi-bit digital gain trim value and the multi-bit compensation voltage value, wherein (a) through (d) are all performed by the integrated circuit.

16. The method of claim 15, wherein there is a high common mode voltage that is present on both the first and second voltage input nodes during a time period when the analog-to-digital converter is sensing a voltage between the first and second voltage input nodes, wherein the high common mode voltage during the time period is greater than twenty-five volts.

17. The method of claim 15, further comprising:
(e) using the multi-bit compensation voltage value to generate a compensation voltage.

18. The method of claim 17, wherein the input current cancellation circuit comprises a digital processing portion and an average current canceling circuit portion, wherein (d) comprises supplying the multi-bit digital gain trim value to the digital processing portion, and wherein (d) further comprises supplying the compensation voltage to the average current canceling circuit portion.

19. The method of claim 18, wherein the digital processing portion comprises a sigma-delta modulator.

20. The method of claim 18, wherein the average current canceling circuit portion comprises a switched-capacitor, serially-modulated, charge injector.

21. The method of claim 15, wherein the integrated circuit further comprises a plurality of voltage input terminals, the method further comprising:
(e) coupling a first selected one of the plurality of voltage input terminals to the first voltage input node and coupling a second selected one of the plurality of voltage input terminals to the second voltage input node so that the voltage sensed by the analog-to-digital converter is a voltage between a selectable pair of the plurality of voltage input terminals; and
(f) changing the selectable pair and then using the analog-to-digital converter to sense a second voltage between the first voltage input node and the second voltage input node and outputting a second multi-bit digital output value from the analog-to-digital converter that is indicative of the second voltage, wherein (e) and (f) are performed by the integrated circuit.

22. The integrated circuit of claim 10, further comprising:

a third voltage input terminal; and a fourth voltage input terminal;

wherein the multi-bit digital output value indicative of the voltage between the first voltage input terminal and the second voltage input terminal is a first multi-bit digital output value, wherein the analog-to-digital converter circuit further outputs a second multi-bit digital output value indicative of a voltage between the second voltage input terminal and the third voltage input terminal, and wherein the analog-to-digital converter circuit further outputs a third multi-bit digital output value indicative of a voltage between the third voltage input terminal and the fourth voltage input terminal, and wherein the digital interface circuit is further usable to read the first, second and third multi-bit digital output values out of the integrated circuit.

23. A method comprising:

(a) storing a multi-bit digital gain trim value on an integrated circuit;

(b) storing a multi-bit compensation voltage value on the integrated circuit;

(c) using an analog-to-digital converter of the integrated circuit to sense a voltage between a first voltage input node of the integrated circuit and a second voltage input node of the integrated circuit, and outputting a multi-bit digital output value from the analog-to-digital converter that is indicative of the voltage sensed; and (d) using an input current cancellation circuit to generate input current cancellation currents and to conduct the input current cancellation currents between the input current cancellation circuit and the first and second voltage input nodes, wherein the input current cancellation circuit has a gain that is a function of both the multi-bit digital gain trim value and the multi-bit compensation voltage value, wherein (a) through (d) are all performed by the integrated circuit.

* * * * *